(12) United States Patent
Dobashi

(10) Patent No.: US 12,288,629 B2
(45) Date of Patent: Apr. 29, 2025

(54) CONDUCTIVE PARTICLES AND CONNECTION STRUCTURE

(71) Applicant: SEKISUI CHEMICAL CO., LTD., Osaka (JP)

(72) Inventor: Yuto Dobashi, Shiga (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 604 days.

(21) Appl. No.: 17/630,602

(22) PCT Filed: Jul. 30, 2020

(86) PCT No.: PCT/JP2020/029209
§ 371 (c)(1),
(2) Date: Jan. 27, 2022

(87) PCT Pub. No.: WO2021/020501
PCT Pub. Date: Feb. 4, 2021

(65) Prior Publication Data
US 2022/0262537 A1    Aug. 18, 2022

(30) Foreign Application Priority Data

Jul. 30, 2019  (JP) ................. 2019-140015

(51) Int. Cl.
*H01B 1/02*       (2006.01)
*H05K 1/02*       (2006.01)
*B82Y 30/00*      (2011.01)

(52) U.S. Cl.
CPC ............ *H01B 1/02* (2013.01); *H05K 1/0265* (2013.01); *B82Y 30/00* (2013.01); *H05K 2201/0302* (2013.01)

(58) Field of Classification Search
CPC ... H01B 1/02; H01B 1/22; H01B 5/00; H05K 1/0265; H05K 2201/0302; H05K 1/181;
(Continued)

(56) References Cited

U.S. PATENT DOCUMENTS

| 2001/0016435 | A1 | 8/2001 | Fujimura |
| 2007/0072313 | A1 | 3/2007 | Yamada et al. |

(Continued)

FOREIGN PATENT DOCUMENTS

| JP | 2001-237039 | 8/2001 |
| JP | 2003-297507 | 10/2003 |

(Continued)

OTHER PUBLICATIONS

International Search Report (ISR) issued Oct. 20, 2020 in International (PCT) Application No. PCT/JP2020/029209.
(Continued)

*Primary Examiner* — Michael C Zarroli
(74) *Attorney, Agent, or Firm* — Wenderoth, Lind & Ponack, L.L.P.

(57) ABSTRACT

A conductive particle including a base particle and a conductive portion disposed on a surface of the base particle, in which a particle diameter of the conductive particle is 30 μm or more, and a ratio of a resistance value (R20) of the conductive particle after loading and unloading up to 20% compression deformation of the conductive particle are repeated 20 times to a resistance value (R1) of the conductive particle after loading and unloading up to 20% compression deformation of the conductive particle are performed once is 1.5 or less.

14 Claims, 5 Drawing Sheets

(58) Field of Classification Search
CPC ......... H05K 3/3436; H05K 2201/0218; H05K 2201/0233; H05K 2201/10962; B82Y 30/00; H01R 11/01
See application file for complete search history.

(56) References Cited

U.S. PATENT DOCUMENTS

| | | | |
|---|---|---|---|
| 2008/0078977 A1* | 4/2008 | Hashiba | C08J 3/12 428/407 |
| 2014/0083740 A1* | 3/2014 | Ishizawa | H05K 3/3494 174/126.1 |

FOREIGN PATENT DOCUMENTS

| | | |
|---|---|---|
| JP | 2010-129455 | 6/2010 |
| JP | 2016-12560 | 1/2016 |
| WO | 2005/059571 | 6/2005 |

OTHER PUBLICATIONS

International Preliminary Report on Patentability issued Feb. 1, 2022 in International (PCT) Application No. PCT/JP2020/029209.

* cited by examiner

[FIG. 1.]
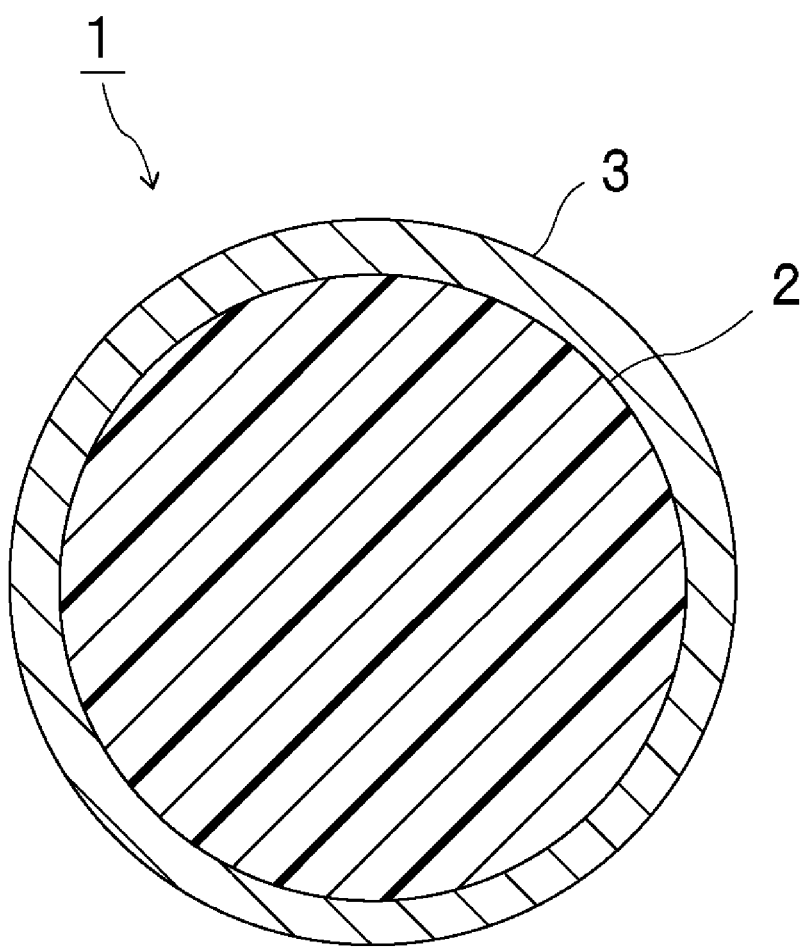

[FIG. 2.]
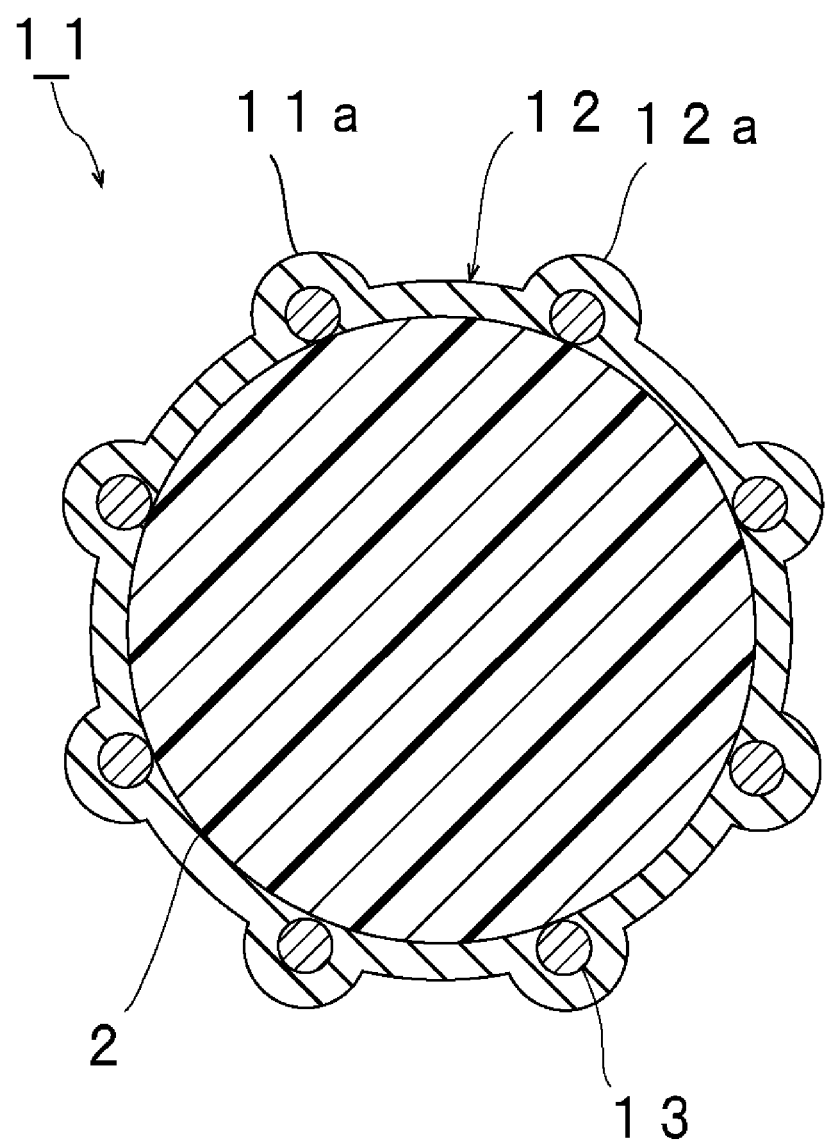

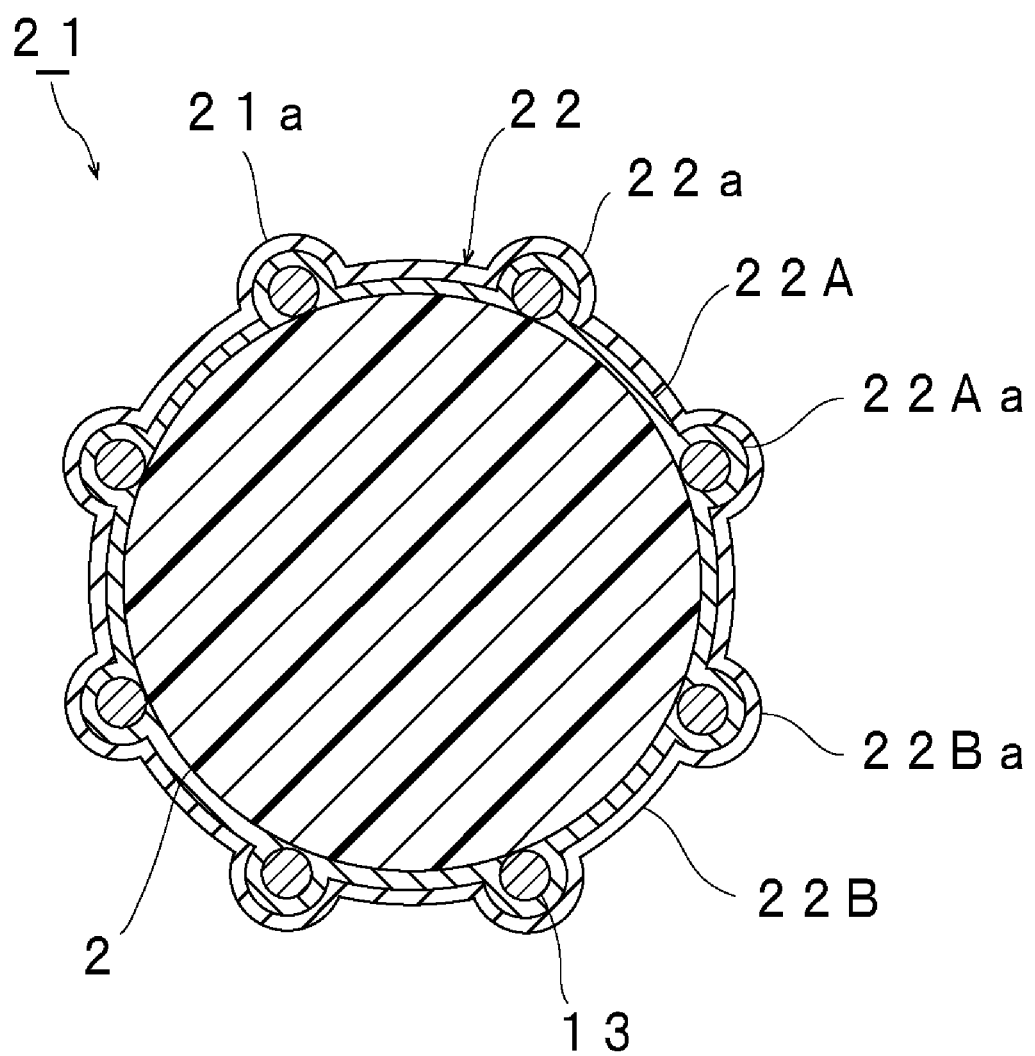

[FIG. 4.]
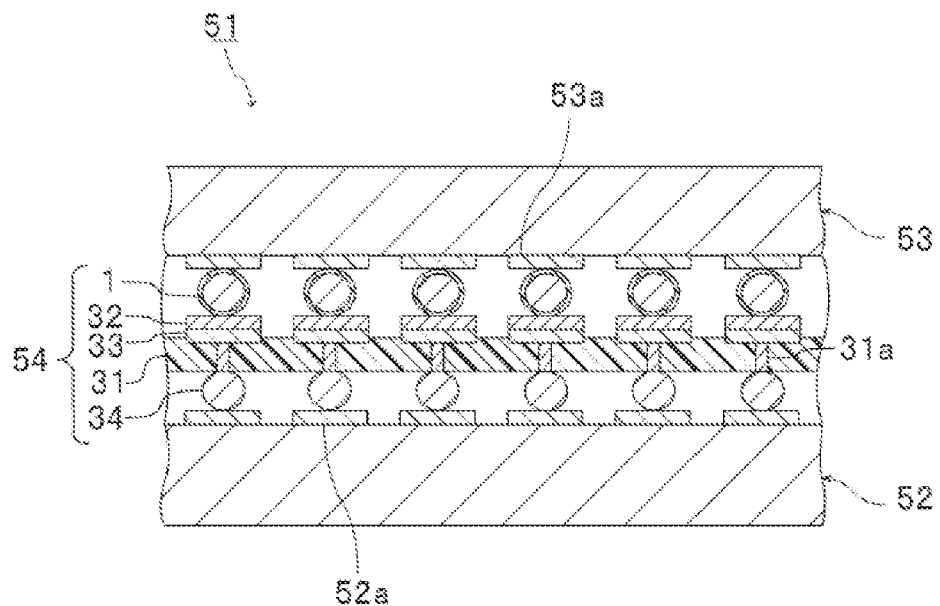
[FIG. 5.] - Prior Art
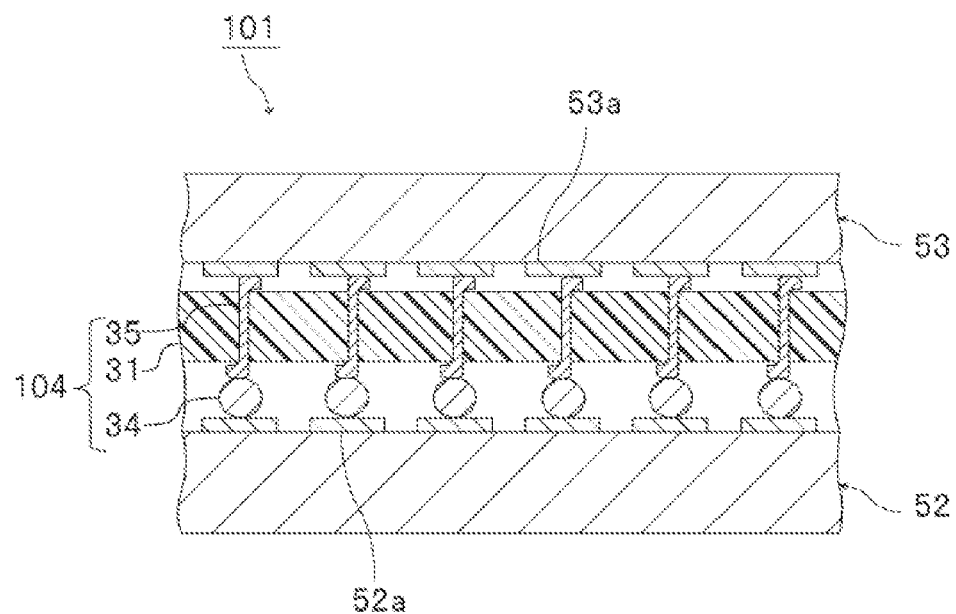

[FIG. 6.]
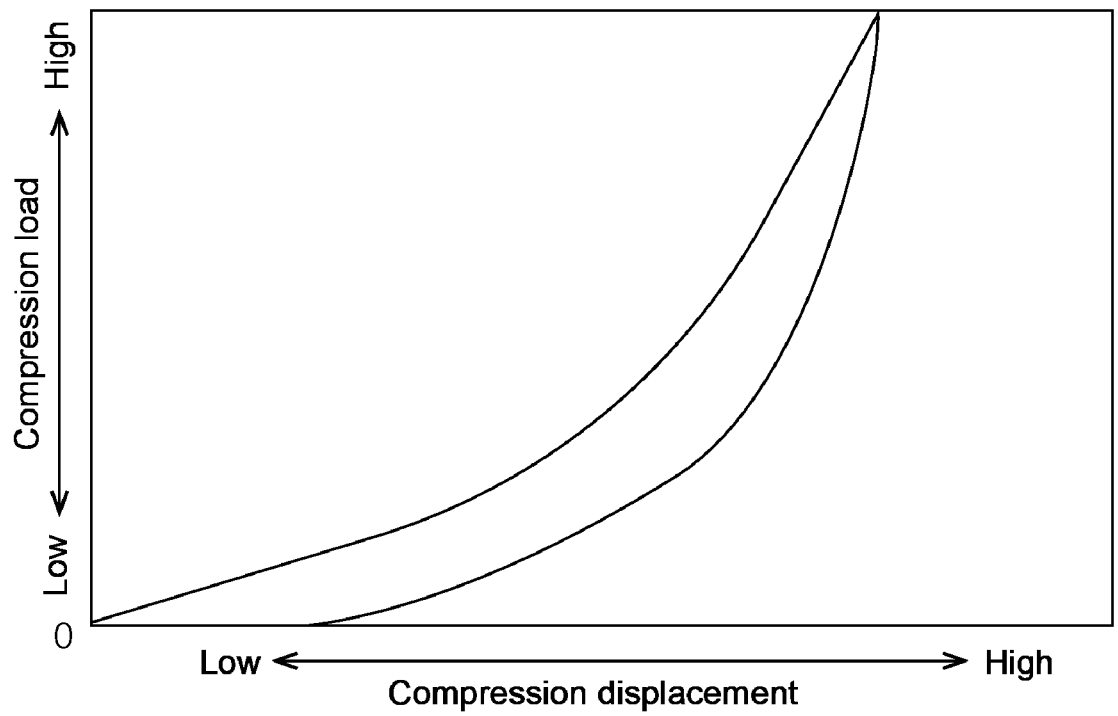
[FIG. 7.]
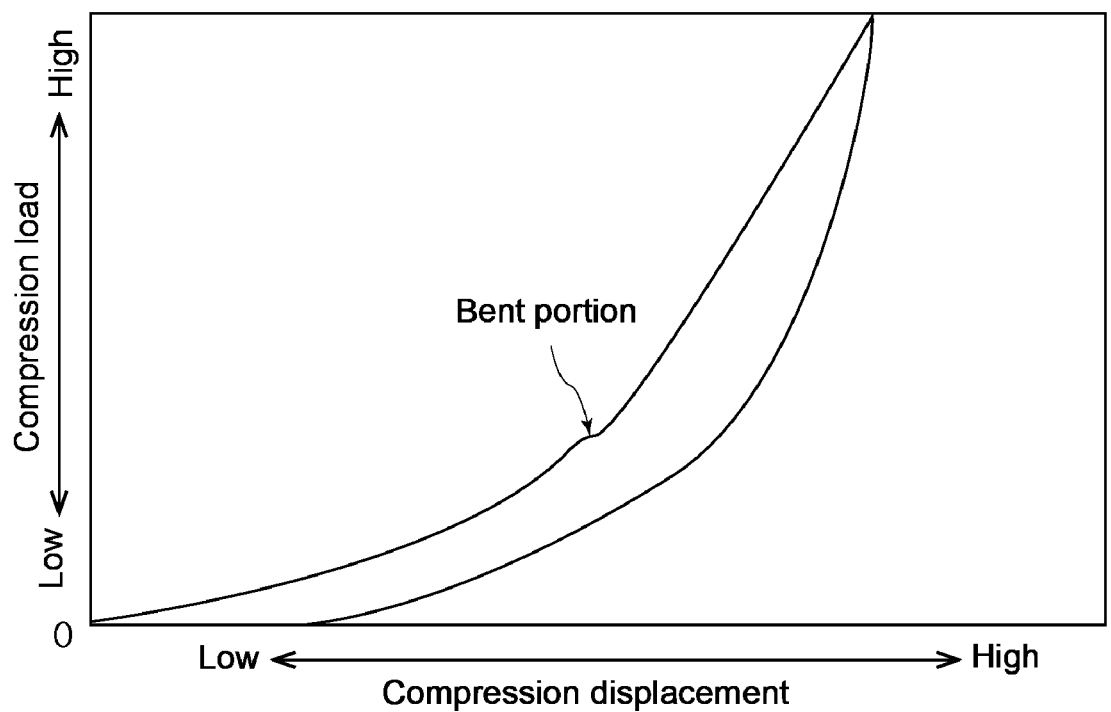

CONDUCTIVE PARTICLES AND CONNECTION STRUCTURE

TECHNICAL FIELD

The present invention relates to a conductive particle in which a conductive portion is disposed on a surface of a base particle. The present invention also relates to a connection structure using the conductive particle.

BACKGROUND ART

In recent years, with an increase in the amount of information and an increase in communication speed due to market expansion of IOT, 5G communication, VR, AR, artificial intelligence, automatic driving systems, and the like, a processor in a data server, a PC, and a mobile terminal is further required to increase an information processing speed.

Examples of a method of processing a large amount of information at high speed include improving processing capacity of a CPU (central processing unit). In order to improve the processing capacity of the CPU, the number of metal terminals (metal pins) of a socket (CPU socket) that connects the CPU to a motherboard is increasing, and a pitch between the pins is becoming narrower.

An example of the socket using the metal terminal (metal pin) is disclosed in Patent Document 1 below. Patent Document 1 below discloses an electronic component socket that is interposed between an electronic component such as a semiconductor element or a semiconductor device and a mounting substrate to detachably mount the electronic component, and electrically connects the electronic component to the mounting substrate. In the electronic component socket, a connection terminal is provided on a mounting surface side of a socket body made of resin. The connection terminal is formed such that a conductor film adheres to an outer surface of a resin bump provided to protrude from the socket body integrally with the socket body. In the electronic component socket, a base end is bonded to an inner surface of the conductor film, a base end side is embedded and sealed in the resin bump and the socket body, and the connection terminal is provided. The connection terminal is formed such that a distal end side of the connection terminal extends in a bent shape from a surface side opposite to the mounting surface of the socket body.

RELATED ART DOCUMENT

Patent Document

Patent Document 1: JP 2003-297507 A

SUMMARY OF THE INVENTION

Problems to be Solved by the Invention

FIG. 5 is a front cross-sectional view schematically showing a connection structure using a metal terminal. A connection structure 101 includes a first connection object member 52, a second connection object member 53, and a connection portion 104. The first connection object member 52 has a plurality of first electrodes 52a on a surface thereof (upper surface). The second connection object member 53 has a plurality of second electrodes 53a on a surface thereof (lower surface). A connection portion 54 includes an insulating member 31, a metal terminal (metal pin) 35, and a solder ball 34. The connection portion 104 is a socket portion formed of a socket. The first connection object member 52 is, for example, a motherboard, and the second connection object member 53 is, for example, a CPU.

In a conventional socket or the like, it is very difficult to process a fine metal terminal (metal pin) in order to cope with further increase in the number of pins and narrowing of the pitch. In addition, by miniaturizing the metal terminal (metal pin), strength of the metal terminal (metal pin) decreases, and the metal terminal (metal pin) may be broken or bent at the time of CPU connection or the like, thereby causing connection failure.

In a socket using a conventional metal terminal (metal pin), it is difficult to cope with further increase in the number of pins and narrowing the pitch, and it is difficult to achieve the increase in information processing speed.

An object of the present invention is to provide conductive particles which can effectively suppress occurrence of connection failure. It is also an object of the present invention to provide a connection structure using the conductive particles.

Means for Solving the Problems

As a result of intensive studies on the above problems, the present inventors have found that the above problems can be solved by using specific conductive particles instead of the metal terminal (metal pin).

According to a broad aspect of the present invention, there is provided a conductive particle including a base particle and a conductive portion disposed on a surface of the base particle, in which a particle diameter of the conductive particle is 30 μm or more, and a ratio of a resistance value of the conductive particle after loading and unloading up to 20% compression deformation of the conductive particle are repeated 20 times to a resistance value of the conductive particle after loading and unloading up to 20% compression deformation of the conductive particle are performed once is 1.5 or less.

According to a broad aspect of the present invention, there is provided a conductive particle including a base particle and a conductive portion disposed on a surface of the base particle, in which a particle diameter of the conductive particle is 30 μm or more, and no bent portion is present in a compressive displacement-compressive load curve in a compression test in which loading and unloading up to 20% compression deformation of the conductive particle are repeated 20 times.

In a specific aspect of the conductive particle according to the present invention, no bent portion is present in the compressive displacement-compressive load curve in a compression test in which loading and unloading up to 30, compression deformation of the conductive particle are repeated 20 times.

According to a broad aspect of the present invention, there is provided a conductive particle including a base particle and a conductive portion disposed on a surface of the base particle, in which a particle diameter of the conductive particle is 30 μm or more, and the conductive particle is used for obtaining a socket or a connector.

In a specific aspect of the conductive particle according to the present invention, a material of the conductive portion contains a ductile metal.

In a specific aspect of the conductive particle according to the present invention, the conductive portion has a two or more-layer laminated structure, and a layer other than an outer surface of the conductive portion includes a layer containing a ductile metal.

In a specific aspect of the conductive particle according to the present invention, the material of the outer surface of the conductive portion is gold, silver, copper, tin, zinc, nickel, beryllium, cobalt, palladium, platinum, rhodium, ruthenium, iridium, or an alloy thereof.

In a specific aspect of the conductive particle according to the present invention, the layer containing the ductile metal has a thickness of 0.6 μm or more.

In a specific aspect of the conductive particle according to the present invention, the conductive portion has a thickness of 0.3 μm or more and 20 μm or less.

In a specific aspect of the conductive particle according to the present invention, the conductive portion has a thickness of 0.6 μm or more and 20 μm or less.

In a specific aspect of the conductive particle according to the present invention, a ratio of the particle diameter of the conductive particle to the thickness of the conductive portion is 5 or more and 300 or less.

In a specific aspect of the conductive particle according to the present invention, the conductive particle has a plurality of protrusions on an outer surface of the conductive portion.

In a specific aspect of the conductive particle according to the present invention, a load required for 20% compression deformation of the conductive particle is 50 N or less.

In a specific aspect of the conductive particle according to the present invention, a load required for 30% compression deformation of the conductive particle is 100 N or less.

According to a broad aspect of the present invention, there is provided a connection structure including a first connection object member having a first electrode on its surface, a second connection object member having a second electrode on its surface, and a connection portion having an insulating member and a conductive particle, in which the conductive particle is the above-described conductive particle, and the first electrode and the second electrode are electrically connected to each other by the conductive particle.

Effect of the Invention

The conductive particle according to the present invention includes the base particle and the conductive portion disposed on the surface of the base particle. In the conductive particle according to the present invention, the conductive particle has a particle diameter of 30 μm or more. In the conductive particle according to the present invention, the ratio of the resistance value of the conductive particle after loading and unloading up to 20% compression deformation of the conductive particle are repeated 20 times to the resistance value of the conductive particle after loading and unloading up to 20% compression deformation of the conductive particle are performed once is 1.5 or less. The conductive particle according to the present invention is configured as described above, so that occurrence of connection failure can be effectively suppressed.

The conductive particle according to the present invention includes the base particle and the conductive portion disposed on the surface of the base particle. In the conductive particle according to the present invention, the conductive particle has a particle diameter of 30 μm or more. In the conductive particle according to the present invention, no bent portion is present in the compressive displacement-compressive load curve in the compression test in which loading and unloading up to 20% compression deformation of the conductive particle are repeated 20 times. The conductive particle according to the present invention is configured as described above, so that occurrence of connection failure can be effectively suppressed.

The conductive particle according to the present invention includes the base particle and the conductive portion disposed on the surface of the base particle. In the conductive particle according to the present invention, the conductive particle has a particle diameter of 30 μm or more. The conductive particle according to the present invention is used for obtaining a socket or a connector. The conductive particle according to the present invention is configured as described above, so that occurrence of connection failure can be effectively suppressed.

BRIEF DESCRIPTION OF DRAWINGS

FIG. 1 is a cross-sectional view showing a conductive particle according to a first embodiment of the present invention.

FIG. 2 is a cross-sectional view showing a conductive particle according to a second embodiment of the present invention.

FIG. 3 is a cross-sectional view showing a conductive particle according to a third embodiment of the present invention.

FIG. 4 is a front cross-sectional view schematically showing a connection structure using the conductive particle according to the first embodiment of the present invention.

FIG. 5 is a front cross-sectional view schematically showing the connection structure using a metal terminal.

FIG. 6 is a schematic diagram for explaining the presence or absence of a bent portion in a two-dimensional graph showing a compressive displacement (X-axis)-compressive load (Y-axis) curve in a compression test of the conductive particle according to an embodiment of the present invention.

FIG. 7 is a schematic diagram for explaining the presence or absence of the bent portion in the two-dimensional graph showing the compressive displacement (X-axis)-compressive load (Y-axis) curve in the compression test of the conductive particle according to an embodiment of the present invention.

MODE(S) FOR CARRYING OUT THE INVENTION

Hereinafter, the details of the present invention will be described.

(Conductive Particle)

The conductive particle according to the present invention includes the base particle and the conductive portion disposed on the surface of the base particle. In the conductive particle according to the present invention, the conductive particle has a particle diameter of 30 μm or more. In the conductive particle according to the present invention, the ratio of the resistance value of the conductive particle after loading and unloading up to 20% compression deformation of the conductive particle are repeated 20 times to the resistance value of the conductive particle after loading and unloading up to 20% compression deformation of the conductive particle are performed once is 1.5 or less.

The conductive particle according to the present invention includes the base particle and the conductive portion disposed on the surface of the base particle. In the conductive particle according to the present invention, the conductive particle has a particle diameter of 30 μm or more. In the conductive particle according to the present invention, no bent portion is present in the compressive displacement-compressive load curve in the compression test in which loading and unloading up to 20, compression deformation of the conductive particle are repeated 20 times.

The conductive particle according to the present invention includes the base particle and the conductive portion disposed on the surface of the base particle. In the conductive particle according to the present invention, the conductive particle has a particle diameter of 30 μm or more. The conductive particle according to the present invention is used for obtaining a socket or a connector. The conductive particle according to the present invention is a conductive particle that can be used to obtain a socket or a connector.

The conductive particles according to the present invention are each configured as described above, so that occurrence of connection failure can be effectively suppressed.

In recent years, with an increase in the amount of information and an increase in communication speed due to market expansion of IOT, 5G communication, VR, AR, artificial intelligence, automatic driving systems, and the like, a processor in a data server, a PC, and a mobile terminal is further required to increase an information processing speed.

Examples of a method of processing a large amount of information at high speed include improving processing capacity of a CPU (central processing unit). In order to improve the processing capacity of the CPU, the number of metal terminals (metal pins) of a socket (CPU socket) that connects the CPU to a motherboard is increasing, and a pitch between the pins is becoming narrower.

In a conventional socket or the like, it is very difficult to process a fine metal terminal (metal pin) in order to cope with further increase in the number of pins and narrowing of the pitch. In addition, by miniaturizing the metal terminal (metal pin), strength of the metal terminal (metal pin) decreases, and the metal terminal (metal pin) may be broken or bent at the time of CPU connection or the like, thereby causing connection failure.

In a socket using a conventional metal terminal (metal pin), it is difficult to cope with further increase in the number of pins and narrowing the pitch, and it is difficult to achieve the increase in information processing speed.

As a result of intensive studies on the above problems, the present inventors have found that the above problems can be solved by using specific conductive particles instead of the metal terminal (metal pin). The conductive particle according to the present invention can effectively suppress occurrence of cracking in the conductive portion even when repeatedly compressed. Thus, the conductive particle can be used instead of the metal terminal (metal pin), and can cope with further narrowing of the pitch. As a result, it is possible to cope with the increase in the information processing speed of the CPU or the like.

Since each of the conductive particles according to the present invention is provided with each of the above-described configurations, it is possible to make the conductive portion difficult to crack even when the conductive particles are repeatedly compressed, and thus it is possible to effectively suppress the occurrence of connection failure at the time of CPU connection or the like.

In the present invention, the use of a specific conductive particle greatly contributes to obtain the effects as described above.

In the conductive particle described above, the ratio (R20/R1) of the resistance value (R20) of the conductive particle after loading and unloading up to 20% compression deformation of the conductive particle are repeated 20 times to the resistance value (R1) of the conductive particle after loading and unloading up to 20% compression deformation of the conductive particle are performed once preferably satisfies the following range. That is, the ratio (R20/R1) is preferably 0.5 or more, more preferably 0.8 or more, and preferably 1.5 or less, more preferably 1.3 or less. When the ratio (R20/R1) is the above lower limit or more and the above upper limit or less, the occurrence of connection failure can be more effectively suppressed.

The resistance value (R1) and the resistance value (R20) can be measured as follows.

Using a micro compression testing machine, a process of applying a load at a smooth indenter end face of a cylinder (diameter of 500 μm, made of BeCu/Au on stainless steel) at 25° C. until the conductive particle is 20% compressed and deformed in a center direction of the conductive particle and performing unloading is defined as 1 cycle, and a compression test of 20 cycles in total is performed. After 20% compression deformation at the first cycle, conduction resistance is measured in the state of 20% compression deformation, and is defined as the resistance value (R1). Similarly, after 20% compression deformation at the 20th cycle, the conduction resistance is measured in the state of 20% compression deformation, and is defined as the resistance value (R2). As the micro compression testing machine, "ENT-NEXUS" manufactured by Elionix Inc., "Microautograph MST-I" manufactured by Shimadzu Corporation, and the like are used.

In the conductive particle, it is preferable that no bent portion is present in the compressive displacement-compressive load curve in the compression test in which loading and unloading up to 20% compression deformation of the conductive particle are repeated 20 times. In the conductive particle, it is preferable that no bent portion is present in the compressive displacement-compressive load curve (compressive displacement curve) in the compression test in which loading and unloading up to 30% compression deformation of the conductive particle are repeated 20 times.

In the present invention, the expression that "no bent portion is present" means that a rapid displacement does not occur in the compression displacement curve in a two-dimensional graph showing a relationship between a compression displacement (X-axis) and a compression load (Y-axis) during a compression test in which loading and unloading up to 20% or 30% compression are repeated 20 times at a load application speed of 0.3 mN/sec. For example, FIG. 6 shows a result of a compression test in which loading and unloading are repeated once up to 20% compression. FIG. 6 shows the two-dimensional graph in which there is no bent portion during the compression test. FIG. 6 shows the result of the compression test in which loading and unloading are repeated once up to 20% compression, and in the present invention, even in a compression test in which loading and unloading up to 20% compression are repeated 20 times, no bent portion is present during the compression test.

In the present invention, the expression that "a bent portion is present" means that the rapid displacement occurs in the compression displacement curve in the two-dimensional graph showing the relationship between the compression displacement (X-axis) and the compression load (Y-axis) during the compression test in which loading and unloading up to 20% or 30% compression are repeated 20 times at a load application speed of 0.3 mN/sec. The rapid displacement in the compressive displacement curve occurs, for example, when a large crack having a length of 50% or more of the particle diameter occurs in the conductive particle along the surface of the conductive particle. For example, FIG. 7 shows a result of the compression test in which loading and unloading are repeated once up to 20% compression. FIG. 7 shows the two-dimensional graph in which there is the bent portion during the compression test.

Specifically, the presence or absence of the bent portion can be confirmed as follows.

Using a micro compression testing machine, a process of applying a load at a smooth indenter end face of a cylinder (diameter of 500 μm, made of diamond) at 25° C. under the conditions of a compression rate of 0.3 mN/sec until the conductive particle is 20% or 30% compressed and deformed in a center direction of the conductive particle and performing unloading is defined as 1 cycle, and a compression test of cycles in total is performed. The compressive displacement (μm) and the compressive load (mN) during this period are measured, and the presence or absence of the bent portion in the compressive displacement curve indicating the relationship between the compression displacement (X-axis) and the compression load (Y-axis) is confirmed. As the micro compression testing machine, "ENT-NEXUS" manufactured by Elionix Inc., "Microautograph MST-I" manufactured by Shimadzu Corporation, and the like are used.

From the viewpoint of more effectively suppressing the occurrence of connection failure, the load required for 20% compression deformation of the conductive particle is preferably 50 N or less.

From the viewpoint of more effectively suppressing the occurrence of connection failure, the load required for 30% compression deformation of the conductive particle is preferably 100 N or less.

The particle diameter of the conductive particle is 30 μm or more. The particle diameter of the conductive particle is preferably 100 μm or more, more preferably 200 μm or more, further preferably 300 μm or more, and preferably 2000 μm or less, more preferably 1000 μm or less, further preferably 600 μm or less. When the particle diameter of the conductive particle is the above lower limit or more and the above upper limit or less, the conductive particle can be more suitably used for obtaining a socket or a connector. If the particle diameter of the conductive particle is the above lower limit or more and the above upper limit or less, a contact area between the conductive particle and the electrode can be sufficiently increased, the conductive particles aggregated when the conductive portion is formed are hardly formed, and the conductive portion is hardly peeled off from the surface of the base particle.

The particle diameter of the conductive particle is preferably an average particle diameter, and preferably a number average particle diameter. The particle diameter of the conductive particle is determined by, for example, observing arbitrary 50 conductive particles with an electron microscope or an optical microscope, and calculating an average value of the particle diameters of the conductive particles or using a particle size distribution measurement apparatus. In the observation with the electron microscope or the optical microscope, the particle diameter of the conductive particle per particle is determined as a particle diameter corresponding to an equivalent circle diameter. In the observation with the electron microscope or the optical microscope, the average particle diameter obtained from the equivalent circle diameters of arbitrary 50 conductive particles is substantially equal to the average particle diameter corresponding to an equivalent sphere diameter. In the particle size distribution measurement apparatus, the particle diameter of the conductive particle per particle is determined as a particle diameter corresponding to an equivalent sphere diameter. The average particle diameter of the conductive particle is preferably calculated using the particle size distribution measurement apparatus.

A variation coefficient (CV value) of the particle diameter of the conductive particle is preferably 10% or less, more preferably 5% or less. When the variation coefficient of the particle diameter of the conductive particle is the upper limit or less, the contact area between the conductive particle and the electrode can be sufficiently increased.

The variation coefficient (CV value) can be measured as follows.

$$CV \text{ value } (\%) = (\rho/Dn) \times 100$$

ρ: standard deviation of particle diameter of conductive particles

Dn: average value of particle diameter of conductive particles

The shape of the conductive particles is not particularly limited. The shape of the conductive particle may be a spherical shape, a shape other than a spherical shape, or a shape such as a quadrangular prism, a columnar shape, or a flat shape.

Hereinafter, the present invention will be specifically described with reference to the drawings.

FIG. 1 is a cross-sectional view showing the conductive particle according to a first embodiment of the present invention.

A conductive particle 1 shown in FIG. 1 includes a base particle 2 and a conductive portion 3. The conductive portion 3 is disposed on a surface of the base particle 2.

In the first embodiment, the conductive portion 3 is in contact with the surface of the base particle 2. The conductive particle 1 is a covered particle in which the surface of the base particle 2 is covered with the conductive portion 3.

In the conductive particle 1, the conductive portion 3 is a single-layer conductive layer. In the conductive particle 1, the base particle 2 contains a conductive metal inside the base particle 2. In the conductive particle, the conductive portion may cover the entire surface of the base particle, or may cover a part of the surface of the base particle. In the conductive particle, the conductive portion may be a single-layer conductive layer or a multilayer conductive layer including two or more layers.

Unlike conductive particles 11 and 21 described later, the conductive particle 1 does not have a core substance. The conductive particle 1 has no protrusion on the surface. The conductive particle 1 is spherical. The conductive portion 3 has no protrusion on an outer surface. As described above, the conductive particle according to the present invention may not have a protrusion on a conductive surface, and may have a spherical shape.

FIG. 2 is a cross-sectional view showing a conductive particle according to a second embodiment of the present invention.

The conductive particle 11 shown in FIG. 2 includes the base particle 2, a conductive portion 12, and a plurality of core substances 13. The conductive portion 12 is disposed on the surface of the base particle 2 so as to be in contact with the base particle 2.

In the conductive particle 11, the conductive portion 12 is a single-layer conductive layer. In the conductive particle 11, the base particle 2 contains a conductive metal inside the base particle 2. In the conductive particle, the conductive portion may cover the entire surface of the base particle, or may cover a part of the surface of the base particle. In the conductive particle, the conductive portion may be a single-layer conductive layer or a multilayer conductive layer including two or more layers.

The conductive particle 11 has a plurality of protrusions 11a on a conductive surface. The conductive portion 12 has a plurality of protrusions 12a on an outer surface. The plurality of core substances 13 are arranged on the surface of the base particle 2. The plurality of core substances 13 are embedded in the conductive portion 12. The core substance 13 is disposed inside the protrusions 11a and 12a. The conductive portion 12 covers the plurality of core substances 13. The outer surface of the conductive portion 12 is raised by the plurality of core substances 13, and the protrusions 11a and 12a are formed.

FIG. 3 is a cross-sectional view showing a conductive particle according to a third embodiment of the present invention.

A conductive particle 21 shown in FIG. 3 includes the base particle 2, a conductive portion 22, and the plurality of core substances 13. The conductive portion 22 as a whole has a first conductive portion 22A on the base particle 2 side and a second conductive portion 22B on a side opposite to the base particle 2 side.

The conductive particle 11 and the conductive particle 21 are different from each other only in the conductive portion. That is, while the conductive portion 12 having a single layer structure is formed in the conductive particle 11, the first conductive portion 22A and the second conductive portion 22B, which have a double layer structure, are formed in the conductive particle 21. The first conductive portion 22A and the second conductive portion 22B are formed as different conductive portions.

The first conductive portion 22A is disposed on the surface of the base particle 2. The first conductive portion 22A is disposed between the base particle 2 and the second conductive portion 22B. The first conductive portion 22A is in contact with the base particle 2. The second conductive portion 22B is in contact with the first conductive portion 22A. Therefore, the first conductive portion 22A is disposed on the surface of the base particle 2, and the second conductive portion 22B is disposed on a surface of the first conductive portion 22A. The conductive particle 21 has a plurality of protrusions 21a on a conductive surface. The conductive portion 22 has a plurality of protrusions 22a on an outer surface. The first conductive portion 22A has a plurality of protrusions 22Aa on an outer surface. The second conductive portion 22B has a plurality of protrusions 22Ba on the outer surface.

Hereinafter, other details of the conductive particles will be described.

(Base Particle)

The material of the base particle is not particularly limited. The material of the base particle may be an organic material or an inorganic material. Examples of the base particle formed only of the organic material include resin particles. Examples of the base particle formed only of the inorganic material include inorganic particles excluding metal. Examples of the base particle formed of both the organic material and the inorganic material include organic-inorganic hybrid particles. From the viewpoint of further improving compression characteristics of the base particle, the base particle is preferably a resin particle or an organic-inorganic hybrid particle, and more preferably a resin particle.

Examples of the organic material include polyolefin resins such as polyethylene, polypropylene, polystyrene, polyvinyl chloride, polyvinylidene chloride, polyisobutylene, and polybutadiene; acrylic resins such as polymethyl methacrylate and polymethyl acrylate; polycarbonate, polyamide, phenol formaldehyde resin, melamine formaldehyde resin, benzoguanamine formaldehyde resin, urea formaldehyde resin, phenol resin, melamine resin, benzoguanamine resin, urea resin, epoxy resin, unsaturated polyester resin, saturated polyester resin, polyethylene terephthalate, polysulfone, polyphenylene oxide, polyacetal, polyimide, polyamideimide, polyether ether ketone, polyether sulfone, divinylbenzene polymer, and divinylbenzene-based copolymer. Examples of the divinylbenzene copolymer include divinylbenzene-styrene copolymer and divinylbenzene-(meth)acrylate copolymer. Since the compression characteristics of the base particle can be easily controlled within a preferable range, the material for the base particle is preferably a polymer obtained by polymerizing one or two or more polymerizable monomers having an ethylenically unsaturated group.

When the base particle is obtained by polymerizing the polymerizable monomer having an ethylenically unsaturated group, examples of the polymerizable monomer having an ethylenically unsaturated group include non-crosslinkable monomers and crosslinkable monomers.

Examples of the non-crosslinkable monomers include, as a vinyl compound, styrene monomers such as styrene, α-methyl styrene, and chlorostyrene; a vinyl ether compound such as methyl vinyl ether, ethyl vinyl ether, and propyl vinyl ether; an acid vinyl ester compound such as vinyl acetate, vinyl butylate, vinyl laurate, and vinyl stearate; and a halogen-containing monomer such as vinyl chloride, and vinyl fluoride; as a (meth)acrylic compound, an alkyl (meth)acrylate compound such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; an oxygen atom-containing (meth)acrylate compound such as 2-hydroxyethyl (meth)acrylate, glycerol (meth)acrylate, polyoxyethylene (meth)acrylate, and glycidyl (meth)acrylate; a nitrile-containing monomer such as (meth)acrylonitrile; and a halogen-containing (meth)acrylate compound such as trifluoromethyl (meth)acrylate, and pentafluoroethyl (meth)acrylate; as an α-olefin compound, an olefin compound such as diisobutylene, isobutylene, LINEALENE, ethylene, and propylene; and as a conjugated diene compound, isoprene, butadiene, and the like.

Examples of the crosslinkable monomer include, as a vinyl compound, a vinyl-based monomer such as divinylbenzene, 1,4-divinyloxybutane, and divinyl sulfone; as a (meth)acrylic compound, a polyfunctional (meth)acrylate compound such as tetramethylolmethane tetra(meth)acrylate, polytetramethylene glycol diacrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, polyethylene glycol di(meth)acrylate, polypropylene glycol di(meth)acrylate, polytetramethylene glycol di(meth)acrylate, and 1,4-butanediol di(meth)acrylate; as an allyl compound, triallyl (iso)cyanurate, triallyl trimellitate, diallyl phthalate, diallyl acrylamide, and diallyl ether; as a silane compound, a silane alkoxide compound such as tetramethoxysilane, tetraethoxysilane, methyltrimethoxysilane, methyltriethoxysilane, ethyltrimethoxysilane, ethyltriethoxysilane, isopropyltrimethoxysilane, isobutyltrimethoxysilane, cyclohexyl trimethoxysilane, n-hexyltrimethoxysilane, n-octyltriethoxysilane, n-decyltrimethoxysilane, phenyltrimethoxysilane, dimethyldimethoxysilane, dimethyidiethoxysilane, diisopropyldimethoxysilane, trimethoxysilyl styrene, γ-(meth)acryloxypropyltrimethoxysilane, 1,3-divinyltetramethyldisiloxane, methylphenyldimethoxysilane, and diphenyidimethoxysilane; a polymerizable double bond-containing silane alkoxide such as vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyl trimethoxysilane, 3-methacryloxypropylmethyldiethoxysilane, 3-methacryloxypropyl triethoxy silane, and 3-acryloxypropyltrimethoxysilane; a cyclic siloxane such as decamethylcyclopentasiloxane; a modified (reactive) silicone oil such as one-terminal modified silicone oil, both-terminal silicone oil, and side-chain type silicone oil; and a carboxyl group-containing monomer such as (meth)acrylic acid, maleic acid, and maleic anhydride.

The base particle can be obtained by polymerizing the polymerizable monomer having an ethylenically unsaturated group. The polymerization method is not particularly limited, and examples thereof include known methods such as radical polymerization, ionic polymerization, polycondensation (condensation polymerization), addition condensation, living polymerization, and living radical polymerization. Other polymerization methods include suspension polymerization in the presence of a radical polymerization initiator.

Examples of the inorganic material include silica, alumina, barium titanate, zirconia, carbon black, silicate glass, borosilicate glass, lead glass, soda lime glass, and alumina silicate glass.

The base particle may be an organic-inorganic hybrid particle. The base particle may be a core-shell particle. When the base particle is an organic-inorganic hybrid particle, examples of the inorganic substance which is the material of the base particle include silica, alumina, barium titanate, zirconia, and carbon black. It is preferable that the inorganic substance is not a metal. The base particle formed of the silica is not particularly limited, and examples thereof include a base particle obtained by hydrolyzing a silicon compound having two or more hydrolyzable alkoxysilyl groups to form crosslinked polymer particles and then performing firing as necessary. Examples of the organic-inorganic hybrid particles include organic-inorganic hybrid particles formed of crosslinked alkoxysilyl polymer and an acrylic resin.

The organic-inorganic hybrid particle is preferably a core-shell type organic-inorganic hybrid particle having a core and a shell disposed on the surface of the core. The core is preferably an organic core. The shell is preferably an inorganic shell. The base particle is preferably an organic-inorganic hybrid particle having an organic core and an inorganic shell disposed on the surface of the organic core.

Examples of the material of the organic core include the organic material described above.

Examples of the material of the inorganic shell include the inorganic substances exemplified as the material of the base particle described above. The material of the inorganic shell is preferably silica. It is preferable that the inorganic shell is formed by forming metal alkoxide into a shell-like material on the surface of the core by a sol-gel method and then firing the shell-like material. The metal alkoxide is preferably a silane alkoxide. It is preferable that the inorganic shell is formed of a silane alkoxide.

The particle diameter of the base particle is preferably 30 μm or more. The particle diameter of the base particle is preferably 100 μm or more, more preferably 200 μm or more, further preferably 300 μm or more, and preferably 2000 μm or less, more preferably 1000 μm or less, further preferably 600 μm or less. When the particle diameter of the base particle is the above lower limit or more and the above upper limit or less, the conductive particle can be more suitably used for obtaining a socket or a connector. If the particle diameter of the base particle is the above lower limit or more and the above upper limit or less, the contact area between the conductive particle and the electrode can be sufficiently increased, the conductive particles aggregated when the conductive portion is formed are hardly formed, and the conductive portion is hardly peeled off from the surface of the base particle.

The base particle has a particle diameter of particularly preferably 30 μm or more and 1000 μm or less. When the particle diameter of the base particle is in a range of 30 μm or more and 1000 μm or less, the base particle hardly aggregates when the conductive portion is formed on the surface of the base particle, and aggregated conductive particles are hardly formed. When the particle diameter of the base particle is in a range of 100 μm or more and 800 μm or less, the conductive particle can be more suitably used for obtaining a socket or a connector.

The particle diameter of the base particle indicates the diameter when the base particle has a spherical shape, and indicates a diameter in the case of assuming a true sphere equivalent to the volume when the base particle does not have a spherical shape.

The particle diameter of the base particle indicates the number average particle diameter. The particle diameter of the base particle is determined by observing arbitrary 50 base particles with an electron microscope or an optical microscope, and calculating an average value of the particle diameters of the base particles or using a particle size distribution measurement apparatus. In the observation with the electron microscope or the optical microscope, the particle diameter of the base particle per particle is determined as a particle diameter corresponding to an equivalent circle diameter. In the observation with the electron microscope or the optical microscope, the average particle diameter obtained from the equivalent circle diameters of arbitrary 50 base particles is substantially equal to the average particle diameter corresponding to an equivalent sphere diameter. In the particle size distribution measurement apparatus, the particle diameter of the base particle per particle is determined as a particle diameter corresponding to an equivalent sphere diameter.

The average particle diameter of the base particle is preferably calculated using the particle size distribution measurement apparatus. In the case of measuring the particle diameter of the base particle in the conductive particle, for example, the particle diameter can be measured as follows.

The conductive particles are added to and dispersed in "Technovit 4000" manufactured by Kulzer BmbH so as to have a content of 30% by weight, thereby fabricating an embedded resin body for inspection of conductive particles. The cross section of the conductive particle is cut out so as to pass near the center of the conductive particle dispersed in the embedded resin body for inspection using an ion milling apparatus ("IM 4000" manufactured by Hitachi High-Technologies Corporation). Then, using a field emission scanning electron microscope (FE-SEM), 50 conductive particles are randomly selected, and the base particle of each conductive particle is observed. The particle diameter of the base particle in each conductive particle is measured, and the particle diameters are arithmetically averaged to determine the particle diameter of the base particle.

(Conductive Portion)

The conductive particle according to the present invention includes the base particle and the conductive portion disposed on the surface of the base particle. The conductive portion preferably contains metal. The metal constituting the conductive portion is not particularly limited.

Examples of the metal and the conductive metal constituting the conductive portion include gold, silver, palladium, copper, platinum, zinc, iron, tin, lead, aluminum, cobalt, indium, nickel, chromium, titanium, antimony, beryllium, rhodium, ruthenium, iridium, bismuth, thallium, germanium, cadmium, silicon, tungsten, molybdenum, and alloys of these. Furthermore, examples of the metal and the conductive metal constituting the conductive portion include tin-doped indium oxide (ITO) and solder. One kind of the metal constituting the conductive portion may be used alone, and two or more kinds thereof may be used in combination.

From the viewpoint of more effectively lowering connection resistance, the conductive portion preferably contains nickel, gold, palladium, beryllium, cobalt, tin, silver, or copper, and more preferably contains nickel, gold, or copper.

From the viewpoint of more effectively suppressing the occurrence of cracking in the conductive portion and more effectively suppressing the occurrence of connection failure, the material of the conductive portion preferably contains a ductile metal. The ductile metal preferably has ductility. Specifically, the ductile metal preferably has an elongation rate at 23° C. of 5% or more and 65% or less, and more preferably has an elongation rate at 23° C. of 10% or more and 60% or less. Examples of the ductile metal include gold, copper, zinc, tin, aluminum, titanium, and alloys thereof. One kind of the ductile metal may be used alone, and two or more kinds thereof may be used in combination.

The elongation rate at 23° C. of the ductile metal can be measured as follows.

A ductile metal film having a thickness of 1 μm is formed on one surface of a PET film (G2) (manufactured by Teijin DuPont, 20 mm×50 mm size) using a ductile metal. A tensile test is performed to measure an elongation at the time when the ductile metal film breaks. The elongation is measured at 23° C. and a test speed of 1 mm/min using a tensile tester ("EZ-LX HS" manufactured by Shimadzu Corporation). From the obtained results, the elongation rate is calculated by the following formula.

Elongation rate (%)=(L1−L0)/L0×100

L1: length of ductile metal film at break
L0: length of ductile metal film before test The content of the ductile metal in 100% by weight of metal which is the material of the conductive portion is preferably 10% by weight or more, more preferably 20% by weight or more, and further preferably 40% by weight or more. The upper limit of the content of the ductile metal in 100% by weight of the metal which is the material of the conductive portion is not particularly limited. The content of the ductile metal in 100% by weight of the metal which is the material of the conductive portion may be 100% by weight (total amount) or less than 100% by weight. When the content of the ductile metal is the above lower limit or more, it is possible to more effectively suppress the occurrence of cracking in the conductive portion and more effectively suppress the occurrence of connection failure.

From the viewpoint of more effectively suppressing the occurrence of cracking in the conductive portion and more effectively suppressing the occurrence of connection failure, the ductile metal preferably contains copper, tin, or zinc, more preferably contains copper or tin, and further preferably contains copper.

The content of copper in 100% by weight of the conductive portion containing copper is preferably 10% by weight or more, more preferably 20% by weight or more, and further preferably 40% by weight or more. The upper limit of the content of copper in 100% by weight of the conductive portion containing copper is not particularly limited. The content of copper in 100% by weight of the conductive portion containing copper may be 90% by weight or less. When the content of the copper is the above lower limit or more, it is possible to more effectively suppress the occurrence of cracking in the conductive portion and more effectively suppress the occurrence of connection failure.

The conductive portion may be formed of one layer. The conductive portion may be formed of a plurality of layers. The conductive portion may have a two-layer laminated structure, a two or more-layer laminated structure, a three-layer laminated structure, or a three or more-layer laminated structure. From the viewpoint of more effectively suppressing the occurrence of cracking in the conductive portion and more effectively suppressing the occurrence of connection failure, the conductive portion preferably has a two or more-layer laminated structure.

When the conductive portion has a two or more-layer laminated structure, the material other than the outer surface of the conductive portion preferably contains a ductile metal, and more preferably contains copper, tin, or an alloy thereof. When the material other than the outer surface of the conductive portion is the preferable metal (ductile metal), it is possible to more effectively suppress the occurrence of cracking in the conductive portion and more effectively suppress the occurrence of connection failure.

When the conductive portion has a two or more-layer laminated structure, the conductive portion preferably includes a layer containing a ductile metal. When the conductive portion has a two or more-layer laminated structure, a layer other than the outer surface of the conductive portion preferably includes the layer containing a ductile metal. When the layer other than the outer surface of the conductive portion has the layer containing the ductile metal, it is possible to more effectively suppress the occurrence of cracking in the conductive portion and more effectively suppress the occurrence of connection failure. In particular, when the outer surface is not the layer containing the ductile metal, the presence of the layer containing the ductile metal in the layer other than the outer surface makes it possible to still more effectively suppress the occurrence of cracking in the conductive portion and still more effectively suppress the occurrence of connection failure.

The content of the ductile metal in 100% by weight of metal which is the material of the layer containing the ductile metal is preferably 30% by weight or more, more preferably 60% by weight or more, further preferably 80% by weight or more, and particularly preferably 90% by weight or more. The upper limit of the content of the ductile metal in 100% by weight of the metal which is the material of the layer containing the ductile metal is not particularly limited. The content of the ductile metal in 100% by weight of the metal which is the material of the layer containing the ductile metal may be 100% by weight (total amount) or less than 100% by weight. When the content of the ductile metal is the above lower limit or more, it is possible to more effectively suppress the occurrence of cracking in the conductive portion and more effectively suppress the occurrence of connection failure.

The thickness of the layer containing the ductile metal is preferably 0.6 μm or more, more preferably 1.0 μm or more, further preferably 2.0 μm or more, and particularly preferably 4.0 μm or more. When the thickness of the layer containing the ductile metal is the above lower limit or more, it is possible to more effectively suppress the occurrence of cracking in the conductive portion and more effectively suppress the occurrence of connection failure. The thickness of the layer containing the ductile metal is preferably 20 μm or less, more preferably 10 μm or less, and further preferably 6 μm or less. When the thickness of the layer containing the ductile metal is the above upper limit or less, compression deformation is not inhibited when a force is vertically applied to the conductive particle, and a contact area with a member to be connected can be secured, so that the conduction resistance is stabilized. When there are a plurality of layers containing a ductile metal, the above effect is obtained when a total thickness of the layers containing a ductile metal is the above lower limit or more and the above upper limit or less.

When the conductive portion has a two or more-layer laminated structure, the material of the outer surface of the conductive portion is preferably gold, silver, copper, tin, zinc, nickel, beryllium, cobalt, palladium, platinum, rhodium, ruthenium, iridium, or an alloy thereof, and more preferably gold, copper, or an alloy thereof. When the material of the outer surface of the conductive portion is the preferable metal, it is possible to more effectively lower the connection resistance and more effectively increase corrosion resistance.

A method of forming the conductive portion on the surface of the base particle is not particularly limited. Examples of the method of forming the conductive portion include a method by electroless plating, a method by electroplating, a method by physical collision, a method by mechanochemical reaction, a method by physical vapor deposition or physical adsorption, and a method of coating paste containing a metal powder or paste containing a metal powder and a binder on the surface of the base particle. The method of forming the conductive portion is preferably the method by electroless plating, electroplating, or physical collision. Examples of the method by physical vapor deposition include methods of vacuum deposition, ion plating, ion sputtering and the like. As the method by physical collision, Theta Composer (manufacture by TOKUJU Co., LTD) or the like is used.

The thickness of the conductive particle is preferably 0.3 μm or more, more preferably 0.6 μm or more, further preferably 1 μm or more, and preferably 20 μm or less, more preferably 15 μm or less, further preferably 10 μm or less. The thickness of the conductive portion means the thickness of the entire conductive portion when the conductive portion has a two or more-layer laminated structure. When the thickness of the conductive portion is the above lower limit or more and the above upper limit or less, it is possible to more effectively suppress the occurrence of cracking in the conductive portion and more effectively suppress the occurrence of connection failure. When the thickness of the conductive portion is the above lower limit or more and the above upper limit or less, sufficient conductivity is obtained, and hardening of the conductive particle can be prevented.

When the conductive portion has a two or more-layer laminated structure, the thickness of the conductive portion of the outermost layer is preferably 0.001 μm or more, more preferably 0.01 μm or more, and preferably 10 μm or less, more preferably 8 μm or less. When the thickness of the conductive portion of the outermost layer is the above lower limit or more and the above upper limit or less, covering by the conductive portion of the outermost layer becomes more uniform, and the corrosion resistance can be more effectively enhanced. When the metal constituting the outermost layer is gold, the cost can be reduced as the thickness of the outermost layer is thinner.

The thickness of the conductive portion can be measured, for example, by observing the cross section of the conductive particle using a transmission electron microscope (TEM). With respect to the thickness of the conductive portion, it is preferable to calculate an average value of the thicknesses of arbitrary five positions of the conductive portion as the thickness of the conductive portion of one conductive particle, and it is more preferable to calculate an average value of the thickness of the entire conductive portion as the thickness of the conductive portion of one conductive particle. The thickness of the conductive portion is preferably determined by calculating an average value of the thickness of the conductive portion of each of arbitrary ten conductive particles.

A ratio of the particle diameter of the conductive particle to the thickness of the conductive portion (particle diameter of conductive particle/thickness of conductive portion) is preferably 5 or more, more preferably 10 or more, further more preferably 20 or more, and preferably 800 or less, more preferably 650 or less, further preferably 300 or less. When the ratio (particle diameter of conductive particle/thickness of conductive portion) is the above lower limit or more and the above upper limit or less, it is possible to more effectively suppress the occurrence of cracking in the conductive portion and more effectively suppress the occurrence of connection failure.

(Core Substance)

The conductive particle preferably has a protrusion on the outer surface of the conductive portion. The conductive particle preferably has a protrusion on a conductive surface. The number of the protrusions is preferably a plural number. An oxide film is often formed on the surface of the electrode in contact with the conductive particle. When the conductive particle having a protrusion on the surface of the conductive portion is used, the oxide film can be effectively removed with the protrusion by pressure-bonding the conductive particle and the electrode. Thus, the electrode and the conductive portion are more reliably in contact with each other, the contact area between the conductive particle and the electrode can be sufficiently increased, and the connection resistance can be more effectively reduced. In addition, when the conductive particles are dispersed in a binder and used as a conductive material, the binder between the conductive particle and the electrode can be more effectively eliminated by the protrusion of the conductive particle. Thus, the contact area between the conductive particle and the electrode can be sufficiently increased, and the connection resistance can be more effectively reduced.

Examples of a method of forming the protrusion include a method in which the core substance is attached to the surface of the base particle and then the conductive portion is formed by electroless plating, and a method in which the conductive portion is formed on the surface of the base particle by electroless plating, then the core substance is attached, and in addition, the conductive portion is formed by electroless plating. The core substance may not be used in order to form the protrusion.

Examples of another method of forming the protrusion include a method in which a core substance is added in the middle of forming the conductive portion on the surface of the base particle. In order to form the protrusion, a method of forming the conductive portion on the base particle by electroless plating without using the core substance, then depositing plating in a protrusion shape on the surface of the conductive portion, and further forming the conductive portion by electroless plating may be used.

Examples of a method of attaching the core substance to the surface of the base particle include a method in which the core substance is added to a dispersion of the base particle, and the core substance is accumulated on the surface of the base particle by van der Waals force and attached, and a method in which the core substance is added to a container containing the base particle, and the core substance is attached to the surface of the base particle by a mechanical action such as rotation of the container. From the viewpoint of controlling an amount of the core substance to be attached, the method of attaching the core substance to the surface of the base particle is preferably a method of accumulating and attaching the core substance to the surface of the base particle in the dispersion.

Examples of the substance constituting the core substance include a conductive substance and a non-conductive substance. Examples of the conductive substance include metals, metal oxides, conductive nonmetals such as graphite, and conductive polymers. Examples of the conductive polymer include polyacetylene. Examples of the non-conductive material include silica, alumina, titanium oxide, and zirconia. From the viewpoint of more effectively eliminating the oxide film, the core substance is preferably hard. From the viewpoint of more effectively lowering the connection resistance between the electrodes, the core substance is preferably a metal.

The metal is not particularly limited. Examples of the metal include metals such as gold, silver, copper, platinum, zinc, iron, lead, tin, aluminum, cobalt, indium, nickel, chrome, titanium, antimony, bismuth, germanium and cadmium; and alloys composed of two or more species of metals such as tin-lead alloy, tin-copper alloy, tin-silver alloy, tin-lead-silver alloy, and tungsten carbide. From the viewpoint of more effectively lowering the connection resistance between the electrodes, the metal is preferably nickel, copper, silver, or gold The metal may be the same as or different from the metal constituting the conductive portion (conductive layer).

The shape of the core substance is not particularly limited. The shape of the core substance is preferably massive. Examples of the core substance include a lump in particle form, an agglomerate by agglomeration of a plurality of microparticles, and an infinite lump.

The particle diameter of the core substance is preferably 0.001 µm or more, more preferably 0.05 µm or more, and preferably 0.9 µm or less, more preferably 0.2 µm or less. When the particle diameter of the core substance is the above lower limit or more and the above upper limit or less, the connection resistance between the electrodes can be more effectively lowered.

The particle diameter of the core substance is preferably an average particle diameter, and more preferably a number average particle diameter. The particle diameter of the core substance is determined by observing arbitrary 50 core substances with an electron microscope or an optical microscope, and calculating an average value of the particle diameters of the core substances or using a particle size distribution measurement apparatus. In the observation with the electron microscope or the optical microscope, the particle diameter of the core substance per particle is determined as a particle diameter corresponding to an equivalent circle diameter. In the observation with the electron microscope or the optical microscope, the average particle diameter obtained from the equivalent circle diameters of arbitrary 50 core substances is substantially equal to the average particle diameter corresponding to an equivalent sphere diameter. In the particle size distribution measurement apparatus, the particle diameter of the core substance per particle is determined as a particle diameter corresponding to an equivalent sphere diameter.

The average particle diameter of the core substance is preferably calculated using the particle size distribution measurement apparatus.

The number of the protrusions per conductive particle is preferably 3 or more, and more preferably 5 or more. The upper limit of the number of protrusions is not particularly limited. The upper limit of the number of protrusions can be appropriately selected in consideration of the particle diameter of the conductive particle and the like. When the number of protrusions is the above lower limit or more, the connection resistance between the electrodes can be more effectively lowered.

The number of protrusions can be calculated by observing any conductive particle with an electron microscope or an optical microscope. The number of protrusions is preferably determined by observing arbitrary 50 conductive particles with an electron microscope or an optical microscope and calculating an average value of the number of protrusions in each conductive particle.

The height of the protrusion is preferably 0.001 µm or more, more preferably 0.05 µm or more, and preferably 0.9 µm or less, more preferably 0.2 µm or less. When the height of the protrusion is the above lower limit or more and the above upper limit or less, the connection resistance between the electrodes can be more effectively lowered.

The height of the protrusion can be calculated by observing the protrusion in any conductive particle with an electron microscope or an optical microscope. It is preferable to calculate the height of the protrusion by using an average value of the heights of all the protrusions per conductive particle as the height of the protrusion of one conductive particle. The height of the protrusion is preferably determined by calculating an average value of the height of the protrusion of each of arbitrary 50 conductive particles.

(Application)

The conductive particle is suitably used for obtaining a socket or a connector. The conductive particle is suitably used for obtaining a socket or a connector instead of the metal terminal (metal pin). The conductive particle is preferably used for socket or connector applications. The conductive particle is preferably used for socket or connector applications instead of the metal terminal (metal pin). By using the conductive particle instead of the metal terminal (metal pin), it is possible to cope with further narrowing of the pitch, and it is possible to effectively suppress the occurrence of connection failure at the time of CPU connection or the like. Examples of the socket include a CPU socket, an IC socket, a DIP socket, a PGA socket, an SiP socket, an LGA socket, a CSP socket, a QFN, a QFP socket, a SOP socket, and a BGA socket. Each of the DIP socket, the PGA socket, the SiP socket, the LGA socket, the CSP socket, the QFN, the QFP socket, the SOP socket, and the BGA socket may be a part of the IC socket. Examples of the connector include an FPC connector, a board-to-board connector, a narrow-pitch connector, a DIN connector, a compression connector, a one-piece connector, and a card edge connector.

(Conductive Material)

The conductive particles are preferably dispersed in the binder and used as the conductive material. The conductive material contains the conductive particle described above and the binder. The conductive particles are preferably dispersed in the binder and used, and are preferably dispersed in the binder and used as a conductive material. The conductive material is preferably used for electrical connection between electrodes. Since the conductive particle described above is used in the conductive material, the connection resistance between the electrodes can be more effectively lowered, and occurrence of aggregation of the conductive particles can be more effectively suppressed. Since the conductive particle described above is used in the conductive material, the occurrence of connection failure can be more effectively suppressed.

The binder resin is not particularly limited. As the binder, a known insulating resin or solvent can be used. The binder preferably contains a thermoplastic component (thermoplastic compound) or a curable component and more preferably contains the curable component. Examples of the curable component include a photocurable component and a thermosetting component. The photocurable component preferably contains a photocurable compound and a photoinitiator. The thermosetting component preferably contains a thermosetting compound and a thermosetting agent.

Examples of the binder include a vinyl resin, a thermoplastic resin, a curable resin, a thermoplastic block copolymer, an elastomer, and a solvent. One kind of the binder may be used alone, and two or more kinds thereof may be used in combination.

Examples of the vinyl resin include a vinyl acetate resin, an acrylic resin, and a styrene resin. Examples of the thermoplastic resin include a polyolefin resin, an ethylene-vinyl acetate copolymer resin, and a polyamide resin. Examples of the curable resin include an epoxy resin, a urethane resin, a polyimide resin, and an unsaturated polyester resin. The curable resin may be a room temperature curable resin, a thermosetting resin, a photo-curable resin, or a moisture-curable resin. The curable resin may be used in combination with a curing agent. Examples of the thermoplastic block copolymer include a styrene-butadiene-styrene block copolymer, a styrene-isoprene-styrene block copolymer, a hydrogenated styrene-butadiene-styrene block copolymer, and a hydrogenated styrene-isoprene-styrene block copolymer. Examples of the elastomer include a styrene-butadiene copolymer rubber and an acrylonitrile-styrene block copolymer rubber.

Examples of the solvent include water and an organic solvent. An organic solvent is preferable because it can be easily removed. Examples of the organic solvent include alcohol compounds such as ethanol, ketone compounds such as acetone, methyl ethyl ketone and cyclohexanone, aromatic hydrocarbon compounds such as toluene, xylene and tetramethylbenzene, glycol ether compounds such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and tripropylene glycol monomethyl ether, ester compounds such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate and propylene carbonate, aliphatic hydrocarbon compounds such as octane and decane, and petroleum solvents such as petroleum ether and naphtha.

In addition to the conductive particle and the binder, the conductive material may contain, for example, various additives such as a filler, an extender, a softener, a plasticizer, a polymerization catalyst, a curing catalyst, a colorant, an antioxidant, a thermal stabilizer, a light stabilizer, an ultraviolet absorber, a lubricant, an antistatic agent, and a flame retardant.

As a method of dispersing the conductive particles in the binder, a conventionally known dispersion method can be used, and the dispersion method is not particularly limited. Examples of the method of dispersing the conductive particles in the binder include the following methods: a method in which, after the conductive particles have been added to the binder, the mixture is kneaded by a planetary mixer or the like to be dispersed; a method in which, after the conductive particles have been uniformly dispersed in water or an organic solvent by using a homogenizer or the like, this dispersion solution is added to a binder and kneaded by a planetary mixer or the like to be dispersed; and a method in which, after the binder has been diluted by water, an organic solvent or the like, the conductive particles are added to this solution, and kneaded by a planetary mixer or the like to be dispersed.

The viscosity ($\eta 25$) of the conductive material at 25° C. is preferably 30 Pa·s or more, more preferably 50 Pa·s or more, and preferably 400 Pa·s or less, more preferably 300 Pa·s or less. When the viscosity of the conductive material at 25° C. is the above lower limit or more and the above upper limit or less, the conductive material can be more uniformly applied onto a connection object member, and the occurrence of connection failure can be more effectively suppressed. The viscosity ($\eta 25$) can be appropriately adjusted depending on the type of compounded components and the blending amount.

The viscosity ($\eta 25$) can be measured under conditions of 25° C. and 5 rpm, for example, using an E-type viscometer ("TVE22L" manufactured by Toki Sangyo Co., Ltd.) or the like.

The conductive material may be used as a conductive paste, a conductive film, or the like. When the conductive material is a conductive film, a film not containing a conductive particle may be stacked on the conductive film containing the conductive particle. The conductive paste is preferably an anisotropic conductive paste. The conductive film is preferably an anisotropic conductive film.

The content of the binder in 100% by weight of the conductive material is preferably 10% by weight or more, more preferably 30% by weight or more, further preferably 50% by weight or more, particularly preferably 70% by weight or more, and preferably 99.99% by weight or less, more preferably 99.9% by weight or less. When the content of the binder is the above lower limit or more and the above upper limit or less, the conductive particles are efficiently arranged on the connection object member, and the occurrence of connection failure can be more effectively suppressed.

The content of the conductive particles in 100% by weight of the conductive material is preferably 0.01% by weight or more, more preferably 0.1% by weight or more, and preferably 80% by weight or less, more preferably 60% by weight or less, further preferably 40% by weight or less, particularly preferably 20% by weight or less, most preferably 10% by weight or less. When the content of the conductive particle is the above lower limit or more and the above upper limit or less, the conductive particles are efficiently arranged on the connection object member, and the occurrence of connection failure can be more effectively suppressed.

(Connection Structure)

A connection structure according to the present invention includes a first connection object member having a first electrode on a surface thereof, a second connection object member having a second electrode on a surface thereof, and a connection portion having an insulating member and the conductive particle. In the connection structure according to the present invention, the conductive particle is the above-described conductive particle. In the connection structure according to the present invention, the first electrode and the second electrode are electrically connected to each other by the conductive particles.

The connection portion is preferably a socket portion formed of a socket or a connector portion formed of a connector.

FIG. 4 is a front cross-sectional view schematically showing the connection structure using the conductive particle according to the first embodiment of the present invention.

A connection structure 51 shown in FIG. 4 includes a first connection object member 52, a second connection object member 53, and a connection portion 54. The first connection object member 52 has a plurality of first electrodes 52a on a surface thereof (upper surface). The second connection object member 53 has a plurality of second electrodes 53a on a surface thereof (lower surface). The connection portion 54 includes conductive particles 1, an insulating member 31, a solder paste portion 32, an electrode 33, and solder balls 34. The connection portion 54 is a socket portion. The insulating member 31 has a through hole 31a penetrating an upper surface and a lower surface.

The solder ball 34 is disposed on the first electrode 52a. The insulating member 31 is disposed on the solder ball 34. The electrode 33 is disposed on the insulating member 31. The solder paste portion 32 is disposed on the electrode 33. The conductive particle 1 is disposed on the solder paste portion 32. The second electrode 53a is disposed on the conductive particle 1. A via fill conductive paste is disposed inside the through hole 31a.

One solder ball 34, one electrode 33, one solder paste portion 32, one conductive particle 1, and one second electrode 53a are electrically connected to one first electrode 52a. Therefore, in the connection structure 51, the first electrode 52a and the second electrode 53a are electrically connected to each other by the conductive particle 1.

In FIG. 4, the conductive particle 1 is schematically shown for convenience of illustration. Other conductive particles such as the conductive particles 11 and 21 may be used in place of the conductive particle 1.

In the connection structure according to the present invention, since the above-described conductive particle is used, the occurrence of cracking in the conductive portion can be effectively suppressed even if the conductive particle is repeatedly compressed. Thus, the conductive particle can be used instead of the metal terminal (metal pin), and can cope with further narrowing of the pitch. Since it is possible to make the conductive portion difficult to crack even when the conductive particle according to the present invention is repeatedly compressed, it is possible to effectively suppress the occurrence of connection failure at the time of CPU connection or the like.

Examples of the material of the insulating member include ceramic and resin. Examples of the resin include a fluororesin, a phenol resin, an epoxy resin, and a polyimide resin. Examples of a substrate provided with the insulating member include FR-1, FR-2, FR-3, FR-4, FR-5, XPC, CEM-1, CEM-3, a glass polyimide substrate, a glass PPO substrate, and a BT substrate.

The first connection object member and the second connection object member are not particularly limited. Examples of the first connection object member include a motherboard. Examples of the second connection object member include a semiconductor chip, an IC package, and a CPU.

Examples of the electrode provided on the first and second connection object members include metal electrodes such as a gold electrode, a nickel electrode, a tin electrode, an aluminum electrode, a copper electrode, a molybdenum electrode, a silver electrode, a SUS electrode, and a tungsten electrode. When the electrode is an aluminum electrode, it may be an electrode formed only of aluminum, or may be an electrode with an aluminum layer stacked on the surface of a metal oxide layer. Examples of the material of the metal oxide layer include indium oxide doped with a trivalent metal element and zinc oxide doped with a trivalent metal element. Examples of the trivalent metal element include Sn, Al, and Ga.

The present invention will be specifically described below by way of Examples and Comparative Examples. The present invention is not limited only to the following Examples.

The following particles were provided as the base particles.

Base particle (S1): divinylbenzene copolymer resin particle ("Micropearl GS-L 400" manufactured by Sekisui Chemical Co., Ltd., particle diameter: 400 μm Base particle (S2): divinylbenzene copolymer resin particle ("Micropearl SP-230" manufactured by Sekisui Chemical Co., Ltd., particle diameter: 30 μm Base particle (S3): divinylbenzene copolymer resin particle ("Micropearl GS-L 600" manufactured by Sekisui Chemical Co., Ltd., particle diameter: 600 μm Base particle (S4): divinylbenzene copolymer resin particle ("Micropearl GS-L 1000" manufactured by Sekisui Chemical Co., Ltd., particle diameter: 1000 μm Base particle (S5): acrylic copolymer resin particle ("Micropearl EZ4P-L 400" manufactured by Sekisui Chemical Co., Ltd., particle diameter: 400 μm Base particle (S6): divinylbenzene copolymer resin particle ("Micropearl ELP-L 400" manufactured by Sekisui Chemical Co., Ltd., particle diameter: 400 μm Example 1

Preparation of Conductive Particle 1:

The base particle (S1) was subjected to electroless nickel plating to form a nickel plating layer (first conductive portion) having an average thickness of 0.3 μm on the surface of the base particle (S1). Next, electrolytic copper plating was applied to an outer surface of the nickel plating layer to form a copper plating layer (second conductive portion) having an average thickness of 4.0 μm. Subsequently, electrolytic gold plating was applied to an outer surface of the copper plating layer to form a gold plating layer (third conductive portion) having an average thickness of 0.5 μm. In this way, the conductive particle 1 having a laminated structure of three layers consisting of a nickel plating layer, a copper plating layer, and a gold plating layer was obtained as the conductive portion.

Example 2

Preparation of Conductive Particle 2:

The base particle (S1) was subjected to electroless copper plating to form a copper plating layer having an average thickness of 0.3 μm on the surface of the base particle (S1), and then electrolytic copper plating was performed until the average thickness of the entire copper plating layer reaches 4.0 μm to form a copper plating layer (first conductive portion) having an average thickness of 4.0 μm. Next, electrolytic gold plating was applied to an outer surface of the copper plating layer to form a gold plating layer (second conductive portion) having an average thickness of 0.5 μm. In this way, a conductive particle 2 having a laminated structure of two layers consisting of a copper plating layer and a gold plating layer was obtained as the conductive portion.

Example 3

Preparation of Conductive Particle 3:

The base particle (S1) was subjected to electroless nickel plating to form a nickel plating layer (first conductive portion) having an average thickness of 0.3 μm on the surface of the base particle (S1). Next, the outer surface of the nickel plating layer was electrolytically plated using an electrolytic plating solution containing copper and beryllium to form a copper-beryllium alloy plating layer (copper: beryllium=98% by weight: 2% by weight) (second conductive portion) having an average thickness of 4.0 μm. In this way, a conductive particle 3 having a laminated structure of two layers consisting of a nickel plating layer and a copper beryllium alloy plating layer was obtained as the conductive portion.

Example 4

Preparation of Conductive Particle 4:

The base particle (S1) was subjected to electroless nickel plating to form a nickel plating layer (first conductive portion) having an average thickness of 0.3 μm on the surface of the base particle (S1). Next, the outer surface of the nickel plating layer was electrolytically plated using an electrolytic plating solution containing copper and zinc to form a copper-zinc alloy plating layer (copper: zinc=70% by weight: 30% by weight) (second conductive portion) having an average thickness of 4.0 μm. In this way, a conductive particle 4 having a laminated structure of two layers consisting of a nickel plating layer and a copper zinc alloy plating layer was obtained as the conductive portion.

Example 5

Preparation of Conductive Particle 5:

The base particle (S1) was subjected to electroless nickel plating to form a nickel plating layer (first conductive portion) having an average thickness of 0.3 μm on the surface of the base particle (S1). Next, the outer surface of the nickel plating layer was electrolytically plated using an electrolytic plating solution containing copper and tin to form a copper-tin alloy plating layer (copper: tin=98% by weight: 2% by weight) (second conductive portion) having an average thickness of 4.0 μm. In this way, a conductive particle 5 having a laminated structure of two layers consisting of a nickel plating layer and a copper tin alloy plating layer was obtained as the conductive portion.

Example 6

Preparation of Conductive Particle 6:

The base particle (S1) was subjected to electroless nickel plating to form a nickel plating layer (first conductive portion) having an average thickness of 0.3 μm on the surface of the base particle (S1). Next, electrolytic copper plating was applied to an outer surface of the nickel plating layer to form a copper plating layer (second conductive portion) having an average thickness of 4.0 μm. Next, electrolytic nickel plating was applied to the outer surface of the copper plating layer to form a nickel plating layer (third conductive portion) having an average thickness of 0.5 μm. Next, electrolytic golf plating was applied to the outer surface of the nickel plating layer to form a gold plating layer (fourth conductive portion) having an average thickness of 0.5 μm. In this way, the conductive particle 6 having a laminated structure of four layers consisting of a nickel plating layer, a copper plating layer, a nickel plating layer, and a gold plating layer was obtained as the conductive portion.

Example 7

Preparation of Conductive Particle 7:

The base particle (S1) was subjected to electroless nickel plating to form a nickel plating layer (first conductive portion) having an average thickness of 0.3 μm on the surface of the base particle (S1). Next, electrolytic copper plating was applied to an outer surface of the nickel plating layer to form a copper plating layer (second conductive portion) having an average thickness of 4.0 μm. Subsequently, electrolytic palladium plating was applied to the outer surface of the copper plating layer to form a palladium plating layer (third conductive portion) having an average thickness of 0.5 μm. In this way, the conductive particle 7 having a laminated structure of three layers consisting of a nickel plating layer, a copper plating layer, and a palladium plating layer was obtained as the conductive portion.

Example 8

Preparation of Conductive Particle 8:

The base particle (S1) was subjected to electroless nickel plating to form a nickel plating layer (first conductive portion) having an average thickness of 0.3 μm on the surface of the base particle (S1). Next, electrolytic copper plating was applied to an outer surface of the nickel plating layer to form a copper plating layer (second conductive portion) having an average thickness of 4.0 μm. Subsequently, electrolytic silver plating was applied to an outer surface of the copper plating layer to form a silver plating layer (third conductive portion) having an average thickness of 0.5 μm. In this way, the conductive particle 8 having a laminated structure of three layers consisting of a nickel plating layer, a copper plating layer, and a silver plating layer was obtained as the conductive portion.

Example 9

Preparation of Conductive Particle 9:

The base particle (S1) was subjected to electroless nickel plating to form a nickel plating layer (first conductive portion) having an average thickness of 0.3 μm on the surface of the base particle (S1). Next, electrolytic copper plating was applied to an outer surface of the nickel plating layer to form a copper plating layer (second conductive portion) having an average thickness of 4.0 μm. Subsequently, electrolytic ruthenium plating was applied to the outer surface of the copper plating layer to form a ruthenium plating layer (third conductive portion) having an average thickness of 0.5 µm. In this way, the conductive particle 9 having a laminated structure of three layers consisting of a nickel plating layer, a copper plating layer, and a ruthenium plating layer was obtained as the conductive portion.

Example 10

Preparation of Conductive Particle 10:

The base particle (S1) was subjected to electroless nickel plating to form a nickel plating layer (first conductive portion) having an average thickness of 0.3 µm on the surface of the base particle (S1). Next, electrolytic copper plating was applied to an outer surface of the nickel plating layer to form a copper plating layer (second conductive portion) having an average thickness of 4.0 µm. Subsequently, electrolytic rhodium plating was applied to the outer surface of the copper plating layer to form a rhodium plating layer (third conductive portion) having an average thickness of 0.5 µm. In this way, the conductive particle 10 having a laminated structure of three layers consisting of a nickel plating layer, a copper plating layer, and a rhodium plating layer was obtained as the conductive portion.

Example 11

Preparation of Conductive Particle 11:

The base particle (S1) was subjected to electroless nickel plating to form a nickel plating layer (first conductive portion) having an average thickness of 0.3 µm on the surface of the base particle (S1). Next, electrolytic copper plating was applied to an outer surface of the nickel plating layer to form a copper plating layer (second conductive portion) having an average thickness of 4.0 µm. Subsequently, electrolytic iridium plating was applied to the outer surface of the copper plating layer to form an iridium plating layer (third conductive portion) having an average thickness of 0.5 µm. In this way, the conductive particle 11 having a laminated structure of three layers consisting of a nickel plating layer, a copper plating layer, and an iridium plating layer was obtained as the conductive portion.

Example 12

Preparation of Conductive Particle 12:

The base particle (S1) was subjected to electroless nickel plating to form a nickel plating layer (first conductive portion) having an average thickness of 0.3 µm on the surface of the base particle (S1). Next, electrolytic copper plating was applied to an outer surface of the nickel plating layer to form a copper plating layer (second conductive portion) having an average thickness of 4.0 µm. Subsequently, the outer surface of the copper plating layer was subjected to electrolytic gold-cobalt alloy plating using an electrolytic plating solution containing gold and cobalt to form a gold-cobalt alloy plating layer (gold: cobalt=98% by weight: 2% by weight) (third conductive portion) having an average thickness of 5.0 µm. In this way, the conductive particle 12 having a laminated structure of three layers consisting of a nickel plating layer, a copper plating layer, and a gold-cobalt alloy plating layer was obtained as the conductive portion.

Example 13

Preparation of Conductive Particle 13:

A conductive particle 13 having a laminated structure of three layers consisting of a nickel plating layer, a copper plating layer, and a gold plating layer was obtained in the same manner as in Example 1 except that nickel particles (average particle diameter: 400 nm) were adsorbed in advance as a protrusion core material to the base particle (S1). The conductive particle 13 has a plurality of protrusions on the outer surface of the conductive portion.

Example 14

Preparation of Conductive Particle 14:

A conductive particle 14 having a laminated structure of three layers consisting of a nickel plating layer, a copper plating layer, and a gold plating layer was obtained in the same manner as in Example 1 except that titanium oxide particles (average particle diameter: 400 nm) were adsorbed in advance as a protrusion core material to the base particle (S1). The conductive particle 14 has a plurality of protrusions on the outer surface of the conductive portion.

Example 15

Preparation of Conductive Particle 15:

The base particle (S2) was subjected to electroless nickel plating to form a nickel plating layer (first conductive portion) having an average thickness of 0.1 µm on the surface of the base particle (S2). Next, electrolytic copper plating was applied to an outer surface of the nickel plating layer to form a copper plating layer (second conductive portion) having an average thickness of 0.6 µm. Subsequently, electrolytic gold plating was applied to an outer surface of the copper plating layer to form a gold plating layer (third conductive portion) having an average thickness of 0.03 µm. In this way, the conductive particle 15 having a laminated structure of three layers consisting of a nickel plating layer, a copper plating layer, and a gold plating layer was obtained as the conductive portion.

Example 16

Preparation of Conductive Particle 16:

The base particle (S3) was subjected to electroless nickel plating to form a nickel plating layer (first conductive portion) having an average thickness of 0.3 µm on the surface of the base particle (S3). Next, electrolytic copper plating was applied to an outer surface of the nickel plating layer to form a copper plating layer (second conductive portion) having an average thickness of 6.0 µm. Subsequently, electrolytic gold plating was applied to an outer surface of the copper plating layer to form a gold plating layer (third conductive portion) having an average thickness of 0.5 µm. In this way, the conductive particle 16 having a laminated structure of three layers consisting of a nickel plating layer, a copper plating layer, and a gold plating layer was obtained as the conductive portion.

Example 17

Preparation of Conductive Particle 17:

The base particle (S4) was subjected to electroless nickel plating to form a nickel plating layer (first conductive portion) having an average thickness of 0.5 µm on the surface of the base particle (S4). Next, electrolytic copper plating was applied to an outer surface of the nickel plating layer to form a copper plating layer (second conductive portion) having an average thickness of 10.0 µm. Subsequently, electrolytic gold plating was applied to an outer surface of the copper plating layer to form a gold plating layer (third conductive portion) having an average thickness of 1.0 µm. In this way, the conductive particle 17 having a laminated structure of three layers consisting of a nickel plating layer, a copper plating layer, and a gold plating layer was obtained as the conductive portion.

Example 18

Preparation of Conductive Particle 18:

The base particle (S2) was subjected to electroless nickel plating to form a nickel plating layer (first conductive portion) having an average thickness of 0.3 µm on the surface of the base particle (S2). Next, electrolytic copper plating was applied to an outer surface of the nickel plating layer to form a copper plating layer (second conductive portion) having an average thickness of 5.0 µm. Subsequently, electrolytic gold plating was applied to an outer surface of the copper plating layer to form a gold plating layer (third conductive portion) having an average thickness of 0.03 µm. In this way, the conductive particle 18 having a laminated structure of three layers consisting of a nickel plating layer, a copper plating layer, and a gold plating layer was obtained as the conductive portion.

Example 19

Preparation of Conductive Particle 19:

The base particle (S4) was subjected to electroless nickel plating to form a nickel plating layer (first conductive portion) having an average thickness of 0.5 µm on the surface of the base particle (S4). Next, electrolytic copper plating was applied to an outer surface of the nickel plating layer to form a copper plating layer (second conductive portion) having an average thickness of 2.5 µm. Subsequently, electrolytic gold plating was applied to an outer surface of the copper plating layer to form a gold plating layer (third conductive portion) having an average thickness of 0.5 µm. In this way, the conductive particle 19 having a laminated structure of three layers consisting of a nickel plating layer, a copper plating layer, and a gold plating layer was obtained as the conductive portion.

Example 20

Preparation of Conductive Particle 20:

The base particle (S5) was subjected to electroless nickel plating to form a nickel plating layer (first conductive portion) having an average thickness of 0.3 µm on the surface of the base particle (S5). Next, electrolytic copper plating was applied to an outer surface of the nickel plating layer to form a copper plating layer (second conductive portion) having an average thickness of 4.0 µm. Subsequently, electrolytic gold plating was applied to an outer surface of the copper plating layer to form a gold plating layer (third conductive portion) having an average thickness of 0.5 µm. In this way, the conductive particle 20 having a laminated structure of three layers consisting of a nickel plating layer, a copper plating layer, and a gold plating layer was obtained as the conductive portion.

Example 21

Preparation of Conductive Particle 21:

The base particle (S6) was subjected to electroless nickel plating to form a nickel plating layer (first conductive portion) having an average thickness of 0.3 µm on the surface of the base particle (S6). Next, electrolytic copper plating was applied to an outer surface of the nickel plating layer to form a copper plating layer (second conductive portion) having an average thickness of 4.0 µm. Subsequently, electrolytic gold plating was applied to an outer surface of the copper plating layer to form a gold plating layer (third conductive portion) having an average thickness of 0.5 µm. In this way, the conductive particle 21 having a laminated structure of three layers consisting of a nickel plating layer, a copper plating layer, and a gold plating layer was obtained as the conductive portion.

Example 22

Preparation of Conductive Particle 22:

The base particle (S1) was subjected to electroless nickel plating to form a nickel plating layer (first conductive portion) having an average thickness of 2.3 µm on the surface of the base particle (S1). Next, electrolytic copper plating was applied to an outer surface of the nickel plating layer to form a copper plating layer (second conductive portion) having an average thickness of 2.0 µm. Subsequently, electrolytic gold plating was applied to an outer surface of the copper plating layer to form a gold plating layer (third conductive portion) having an average thickness of 0.5 µm. In this way, the conductive particle 22 having a laminated structure of three layers consisting of a nickel plating layer, a copper plating layer, and a gold plating layer was obtained as the conductive portion.

Example 23

Preparation of Conductive Particle 23:

The base particle (S1) was subjected to electroless nickel plating to form a nickel plating layer (first conductive portion) having an average thickness of 2.8 µm on the surface of the base particle (S1). Next, electrolytic copper plating was applied to an outer surface of the nickel plating layer to form a copper plating layer (second conductive portion) having an average thickness of 1.5 µm. Subsequently, electrolytic gold plating was applied to an outer surface of the copper plating layer to form a gold plating layer (third conductive portion) having an average thickness of 0.5 µm. In this way, the conductive particle 23 having a laminated structure of three layers consisting of a nickel plating layer, a copper plating layer, and a gold plating layer was obtained as the conductive portion.

Example 24

Preparation of Conductive Particle 24:

The base particle (S1) was subjected to electroless nickel plating to form a nickel plating layer (first conductive portion) having an average thickness of 3.3 µm on the surface of the base particle (S1). Next, electrolytic copper plating was applied to an outer surface of the nickel plating layer to form a copper plating layer (second conductive portion) having an average thickness of 1.0 µm. Subsequently, electrolytic gold plating was applied to an outer surface of the copper plating layer to form a gold plating layer (third conductive portion) having an average thickness of 0.5 µm. In this way, the conductive particle 24 having a laminated structure of three layers consisting of a nickel plating layer, a copper plating layer, and a gold plating layer was obtained as the conductive portion.

Comparative Example 1

Preparation of Conductive Particle X1:

The base particle (S1) was subjected to electroless nickel plating to form a nickel plating layer (first conductive portion) having an average thickness of 5.0 μm on the surface of the base particle (S1). Next, electrolytic golf plating was applied to the outer surface of the nickel plating layer to form a gold plating layer (second conductive portion) having an average thickness of 0.5 μm. In this way, a conductive particle X1 having a laminated structure of two layers consisting of a nickel plating layer and a gold plating layer was obtained as the conductive portion.

(Evaluation)

(1) Thickness of Conductive Portion of Conductive Particle

The conductive particles obtained were added to and dispersed in "Technovit 4000" manufactured by Kulzer BmbH so as to have a content of 30, by weight, thereby fabricating an embedded resin body for inspection. The cross section of the conductive particle was cut out so as to pass near the center of the conductive particle dispersed in the embedded resin body for inspection using an ion milling apparatus ("IM 4000" manufactured by Hitachi High-Technologies Corporation).

Thereafter, using a field emission transmission electron microscope (FE-TEM) ("JEM-ARM200F" manufactured by JEOL Ltd.), the image magnification was set to 50,000-fold, 10 conductive particles were randomly selected, and the conductive portion of each conductive particle was observed. The thickness of the conductive portion of each conductive particle was measured, and the value was arithmetically averaged to take as the thickness of the conductive portion.

(2) Particle Diameter of Conductive Particle

The particle diameter of the obtained conductive particle was calculated using a particle size distribution measurement apparatus ("Multisizer 4" manufactured by Beckman Coulter, Inc.). Specifically, the particle diameter was obtained by measuring the particle diameters of about 100,000 conductive particles and calculating the average value.

From the obtained results, the ratio of the particle diameter of the conductive particle to the thickness of the conductive portion (particle diameter of conductive particle/thickness of conductive portion) was calculated.

(3) Resistance Value of Conductive Particle

With respect to the obtained conductive particle, the resistance value (R1) of the conductive particle after loading and unloading up to 20% compression deformation of the conductive particle were performed once and the resistance value (R20) of the conductive particle after loading and unloading up to 20% compression deformation of the conductive particle were repeated 20 times were measured.

The resistance value (R1) and the resistance value (R20) were measured as follows.

The following compression test was performed using a micro compression testing machine ("ENT-NEXUS" manufactured by Elionix Inc.). The conductive particles were sprayed on a substrate obtained by coating a glass plate with Pt, a process of applying a load at a smooth indenter end face of a cylinder (diameter of 500 μm, made of BeCu/Au on stainless steel) at 25° C. until the conductive particle was 20% compressed and deformed in the center direction of the conductive particle and performing unloading was defined as 1 cycle, and the compression test of 20 cycles in total was performed. After 20% compression deformation at the first cycle, the conduction resistance was calculated from a voltage and a current value between an indenter and a substrate measured in the state of 20% compression deformation, and was defined as the resistance value (R1). After 20% compression deformation at the 20th cycle, the conduction resistance was similarly calculated in the state of 20% compression deformation, and was defined as the resistance value (R20).

From the obtained results, the ratio (R20/R1) of the resistance value (R20) to the resistance value (R1) was calculated.

(4) Compression Test of Conductive Particle

With respect to the obtained conductive particle, the presence or absence of the bent portion was confirmed in the compressive displacement-compressive load curve in the compression test (20% compression test or 30% compression test) in which loading and unloading up to 20% or 30% compression deformation of the conductive particle were repeated 20 times.

The presence or absence of the bent portion was confirmed as follows.

The following compression test was performed using a micro compression testing machine ("Microautograph MST-I" manufactured by Shimadzu Corporation). The conductive particles were sprayed on a substrate obtained by coating a glass plate with Pt, a process of applying a load at a smooth indenter end face of a cylinder (diameter of 500 μm, made of diamond) at 25° C. under the conditions of a compression rate of 0.3 mN/sec until the conductive particle was 20% or 30% compressed and deformed in the center direction of the conductive particle and performing unloading was defined as 1 cycle, and the compression test of 20 cycles in total was performed. The compressive displacement (μm) and the compressive load (mN) during this period were measured, and the presence or absence of the bent portion in the compressive displacement curve indicating the relationship between the compression displacement (X-axis) and the compression load (Y-axis) was confirmed.

(5) Cracking of Conductive Portion of Conductive Particle 20 conductive particles after (4) Compression test of conductive particle (20% compression test or 30% compression test) were provided. Using a scanning electron microscope (SEM), the provided conductive particle was observed to confirm whether or not a crack occurred in the conductive portion of the conductive particle. Cracking of the conductive portion of the conductive particle was determined under the following conditions.

[Assessment Criteria for Cracking of Conductive Portion of Conductive Particle]
- ooo: No cracking occurs in the conductive portion of the conductive particle
- oo: Cracks having a length of less than 30% of the particle diameter are generated on the surface of the conductive portion of the conductive particle along the surface of the conductive portion.
- o: Cracks having a length of 30% or more and less than 50% of the particle diameter are generated on the surface of the conductive portion of the conductive particle along the surface of the conductive portion.
- x: Cracks having a length of 50% or more of the particle diameter are generated on the surface of the conductive portion of the conductive particle along the surface of the conductive portion.

(6) Connection Failure 1 in Connection Structure

Using the obtained conductive particle, a connection structure (connection structure having a structure shown in FIG. 4) was prepared as follows.

A BGA substrate in which solder balls and a metal pad (hereinafter, LAND) were electrically connected via a through hole was prepared. In the BGA substrate, a via fill conductive paste is disposed inside the through hole.

The BGA substrate was incorporated into a package receiving unit including a package fixing unit for fixing an IC package. Subsequently, a solder paste was applied onto the LAND on an upper surface of the BGA substrate using a dispenser. The conductive particles obtained using a ball mounter were arranged on the applied solder paste. Subsequently, heating was performed in a reflow oven at 280° C. for 3 minutes under a nitrogen atmosphere. In this way, an IC socket was obtained in which the LAND and the conductive particle were bonded to each other with the solder interposed therebetween, and a lower portion of the BGA substrate incorporated in the package receiving unit and an electric circuit board (motherboard) were bonded to each other with the solder interposed therebetween.

In order to attach the IC package (CPU) to the obtained IC socket, a lever provided in the package fixing unit was raised to open a pressure cover, and the IC socket was set in the package receiving unit such that a LAND portion at a lower portion of the IC package was in contact with the conductive particle disposed on the BGA substrate. By pushing down the lever in a state where the pressure cover was lowered, the pressure cover pushes down the IC package from above, and a vertical load was applied to the IC package to obtain a connection structure.

The obtained connection structure was observed using a scanning electron microscope (SEM) to confirm whether or not connection failure occurred. Connection failure 1 was assessed according to the following criteria.

[Assessment Criteria for Connection Failure 1]
  o: Connection failure does not occur
  x: Connection failure occurs (7) Connection Failure 2 in Connection Structure Two printed boards (10 mm long×10 mm wide) were prepared as the first and second connection object members. In the printed circuit board, 121 through electrodes were formed at a pitch of 0.8 mm on the surface. A solder paste ("M705-GRN360-K2-V" manufactured by Senju Metal Industry Co., Ltd.) was applied onto the LAND of the first connection object member. The obtained conductive particles were arranged on all the LANDs to which the solder paste was applied, and heated in a reflow oven at 250° C. for 30 seconds under a nitrogen atmosphere to mount the conductive particles on the LAND.

Subsequently, the LAND of the second connection object member was pressed against the conductive particle using a ball mounter ("CB-505" manufactured by Athlete FA Corporation), and a vertical load of 30 g was applied to one conductive particle to compress and deform the conductive particle. Thereafter, the pressure of the ball mounter was removed, and after a lapse of 1 minute, the conductive particles were compressed and deformed again using the ball mounter in the same manner to obtain a connection structure. This process was defined as 1 cycle, and the compression test of 20 cycles in total was performed. The conduction resistance of each electrode was measured after 1 cycle and 20 cycles using a resistance measurement device (RM3542A manufactured by HIOKI E.E. CORPORATION), and the resistance value (Q20) after 20 cycles and the resistance value (Q1) after 1 cycle were measured. From the obtained results, for each electrode, a ratio (Q20/Q1) of the resistance value (Q20) to the resistance value (Q1) was calculated, the average thereof was obtained, and evaluation was performed according to the following criteria. In the obtained connection structure, since the through electrode is formed, the resistance value can be measured even when one LAND is disconnected.

[Assessment Criteria for Connection Failure 2]
  ooo: The average of the ratio (Q20/Q1) is 1.0 or more and less than 1.15, and there is no electrode in which the ratio (Q20/Q1) is 1.5 or more.
  oo: The average of the ratio (Q20/Q1) is 1.15 or more and less than 1.3, and there is no electrode in which the ratio (Q20/Q1) is 1.5 or more.
  o: The average of the ratio (Q20/Q1) is 1.3 or more and less than 1.5, and there is no electrode in which the ratio (Q20/Q1) is 1.5 or more.
  x: The result corresponds to at least one of "the average of the ratio (Q20/Q1) is 1.5 or more" and "there is the electrode in which the ratio (Q20/Q1) is 1.5 or more".

The results are shown in Tables 1 to 4 below.

TABLE 1

|  |  | Example 1 | Example 2 | Example 3 | Example 4 | Example 5 | Example 6 |
|---|---|---|---|---|---|---|---|
| Base particle | Type of base particle | S1 | S1 | S1 | S1 | S1 | S1 |
|  | Particle diameter (μm) | 400 | 400 | 400 | 400 | 400 | 400 |
| Conductive particle | Presence or absence of protrusion | Absence | Absence | Absence | Absence | Absence | Absence |
|  | Metal constituting first conductive portion | Ni | Cu | Ni | Ni | Ni | Ni |
|  | Thickness of first conductive portion (μm) | 0.3 | 4.0 | 0.3 | 0.3 | 0.3 | 0.3 |
|  | Metal constituting second conductive portion | Cu | Au | CuBe alloy | CuZn alloy | CuSn alloy | Cu |
|  | Thickness of second conductive portion (μm) | 4.0 | 0.5 | 4.0 | 4.0 | 4.0 | 4.0 |
|  | Metal constituting third conductive portion | Au |  |  |  |  | Ni |
|  | Thickness of third conductive portion (μm) | 0.5 |  |  |  |  | 0.5 |
|  | Metal constituting fourth conductive portion |  |  |  |  |  | Au |
|  | Thickness of fourth conductive portion (μm) |  |  |  |  |  | 0.5 |
|  | Thickness of conductive portion (μm) | 4.8 | 4.5 | 4.3 | 4.3 | 4.3 | 5.3 |
|  | Particle diameter of conductive particle (μm) | 410 | 409 | 409 | 409 | 409 | 411 |
|  | Ratio (particle diameter of conductive particle/thickness of conductive portion) | 85 | 91 | 95 | 95 | 95 | 77 |
|  | Resistance value (R1) (mΩ) | 25 | 31 | 23 | 45 | 51 | 23 |
|  | Resistance value (R20) (mΩ) | 26 | 31 | 30 | 50 | 55 | 33 |
|  | Ratio (R20/R1) | 1.04 | 1.00 | 1.07 | 1.11 | 1.08 | 1.43 |
|  | Presence or absence of beat portion (20% compression test) | Absence | Absence | Absence | Absence | Absence | Absence |
|  | Presence or absence (30% compression test) | Absence | Absence | Absence | Absence | Absence | Absence |
|  | Cracking of conductive portion (20% compression test) | ooo | ooo | ooo | ooo | ooo | oo |

TABLE 1-continued

|  |  | Example 1 | Example 2 | Example 3 | Example 4 | Example 5 | Example 6 |
|---|---|---|---|---|---|---|---|
|  | Cracking of conductive portion (30% compression test) | ◯◯◯ | ◯◯◯ | ◯◯◯ | ◯◯◯ | ◯◯◯ | ◯◯ |
| Connection structure | Connection failure 1 | ◯ | ◯ | ◯ | ◯ | ◯ | ◯ |
|  | Connection failure 2 | ◯◯◯ | ◯◯◯ | ◯◯◯ | ◯◯◯ | ◯◯◯ | ◯◯ |

TABLE 2

|  |  | Example 7 | Example 8 | Example 9 | Example 10 | Example 11 | Example 12 |
|---|---|---|---|---|---|---|---|
| Base particle | Type of base particle | S1 | S1 | S1 | S1 | S1 | S1 |
|  | Particle diameter (μm) | 400 | 400 | 400 | 400 | 400 | 400 |
| Conductive particle | Presence or absence of protrusion | Absence | Absence | Absence | Absence | Absence | Absence |
|  | Metal constituting first conductive portion | Ni | Ni | Ni | Ni | Ni | Ni |
|  | Thickness of first conductive portion (μm) | 0.3 | 0.3 | 0.3 | 0.3 | 0.3 | 0.3 |
|  | Metal constituting second conductive portion | Cu | Cu | Cu | Cu | Cu | Cu |
|  | Thickness of second conductive portion (μm) | 4.0 | 4.0 | 4.0 | 4.0 | 4.0 | 4.0 |
|  | Metal constituting third conductive portion | Pd | Ag | Ru | Rh | Ir | AuCo alloy |
|  | Thickness of third conductive portion (μm) | 0.5 | 0.5 | 0.5 | 0.5 | 0.5 | 0.5 |
|  | Metal constituting fourth conductive portion |  |  |  |  |  |  |
|  | Thickness of fourth conductive portion (μm) |  |  |  |  |  |  |
|  | Thickness of conductive portion (μm) | 4.8 | 4.8 | 4.8 | 4.8 | 4.8 | 4.8 |
|  | Particle diameter of conductive particle (μm) | 410 | 410 | 410 | 410 | 410 | 410 |
|  | Ratio (particle diameter of conductive particle/thickness of conductive portion) | 85 | 85 | 85 | 85 | 85 | 85 |
|  | Resistance value (R1) (mΩ) | 33 | 19 | 35 | 26 | 34 | 25 |
|  | Resistance value (R20) (mΩ) | 38 | 20 | 42 | 28 | 44 | 27 |
|  | Ratio (R20/R1) | 1.15 | 1.05 | 1.20 | 1.08 | 1.29 | 1.08 |
|  | Presence or absence of beat portion (20% compression test) | Absence | Absence | Absence | Absence | Absence | Absence |
|  | Presence or absence (30% compression test) | Absence | Absence | Absence | Absence | Absence | Absence |
|  | Cracking of conductive portion (20% compression test) | ◯◯◯ | ◯◯◯ | ◯◯◯ | ◯◯◯ | ◯◯◯ | ◯◯◯ |
|  | Cracking of conductive portion (30% compression test) | ◯◯◯ | ◯◯◯ | ◯◯◯ | ◯◯◯ | ◯◯ | ◯◯◯ |
| Connection structure | Connection failure 1 | ◯ | ◯ | ◯ | ◯ | ◯ | ◯ |
|  | Connection failure 2 | ◯◯◯ | ◯◯◯ | ◯◯◯ | ◯◯◯ | ◯◯◯ | ◯◯◯ |

TABLE 3

|  |  | Example 13 | Example 14 | Example 15 | Example 16 | Example 17 | Example 18 |
|---|---|---|---|---|---|---|---|
| Base particle | Type of base particle | S1 | S1 | S2 | S3 | S4 | S2 |
|  | Particle diameter (μm) | 400 | 400 | 30 | 600 | 1000 | 30 |
| Conductive particle | Presence or absence of protrusion | Presence (Ni) | Presence (Tio$_2$) | Absence | Absence | Absence | Absence |
|  | Metal constituting first conductive portion | Ni | Ni | Ni | Ni | Ni | Ni |
|  | Thickness of first conductive portion (μm) | 0.3 | 0.3 | 0.1 | 0.3 | 0.5 | 0.3 |
|  | Metal constituting second conductive portion | Cu | Cu | Cu | Cu | Cu | Cu |
|  | Thickness of second conductive portion (μm) | 4.0 | 4.0 | 0.6 | 6.0 | 10.0 | 5.0 |
|  | Metal constituting third conductive portion | Au | Au | Au | Au | Au | Au |
|  | Thickness of third conductive portion (μm) | 0.5 | 0.5 | 0.03 | 0.5 | 1.0 | 0.03 |
|  | Metal constituting fourth conductive portion |  |  |  |  |  |  |
|  | Thickness of fourth conductive portion (μm) |  |  |  |  |  |  |
|  | Thickness of conductive portion (μm) | 4.8 | 4.8 | 0.73 | 6.8 | 11.5 | 5.33 |
|  | Particle diameter of conductive particle (μm) | 410 | 410 | 31 | 614 | 1023 | 41 |
|  | Ratio (particle diameter of conductive particle/thickness of conductive portion) | 85 | 85 | 43 | 90 | 89 | 8 |
|  | Resistance value (R1) (mΩ) | 25 | 27 | 120 | 15 | 9 | 75 |
|  | Resistance value (R20) (mΩ) | 30 | 31 | 160 | 16 | 9 | 80 |
|  | Ratio (R20/R1) | 1.20 | 1.15 | 1.33 | 1.07 | 1.00 | 1.07 |
|  | Presence or absence of beat portion (20% compression test) | Absence | Absence | Absence | Absence | Absence | Absence |
|  | Presence or absence (30% compression test) | Absence | Absence | Absence | Absence | Absence | Absence |
|  | Cracking of conductive portion (20% compression test) | ◯◯◯ | ◯◯◯ | ◯◯◯ | ◯◯◯ | ◯◯◯ | ◯◯◯ |
|  | Cracking of conductive portion (30% compression test) | ◯◯◯ | ◯◯◯ | ◯◯◯ | ◯◯◯ | ◯◯◯ | ◯◯◯ |

TABLE 3-continued

|  |  | Example 13 | Example 14 | Example 15 | Example 16 | Example 17 | Example 18 |
|---|---|---|---|---|---|---|---|
| Connection structure | Connection failure 1 | ○ | ○ | ○ | ○ | ○ | ○ |
|  | Connection failure 2 | ○○○ | ○○○ | ○○○ | ○○○ | ○○○ | ○○○ |

TABLE 4

|  |  | Example 19 | Example 20 | Example 21 | Comparative Example 1 |
|---|---|---|---|---|---|
| Base particle | Type of base particle | S4 | S5 | S6 | S1 |
| Conductive particle | Particle diameter (μm) | 1000 | 400 | 400 | 400 |
|  | Presence or absence of protrusion | Absence | Absence | Absence | Absence |
|  | Metal constituting first conductive portion | Ni | Ni | Ni | Ni |
|  | Thickness of first conductive portion (μm) | 0.5 | 0.3 | 0.3 | 5.0 |
|  | Metal constituting second conductive portion | Cu | Cu | Cu | Au |
|  | Thickness of second conductive portion (μm) | 2.5 | 4.0 | 4.0 | 0.5 |
|  | Metal constituting third conductive portion | Au | Au | Au |  |
|  | Thickness of third conductive portion (μm) | 0.5 | 0.5 | 0.5 |  |
|  | Metal constituting fourth conductive portion |  |  |  |  |
|  | Thickness of fourth conductive portion (μm) |  |  |  |  |
|  | Thickness of conductive portion (μm) | 3.5 | 4.8 | 4.8 | 5.5 |
|  | Particle diameter of conductive particle (μm) | 1007 | 410 | 410 | 411 |
|  | Ratio (particle diameter of conductive particle/thickness of conductive portion) | 288 | 85 | 85 | 75 |
|  | Resistance value (R1) (mΩ) | 52 | 23 | 24 | 140 |
|  | Resistance value (R20) (mΩ) | 75 | 30 | 32 | 205 |
|  | Ratio (R20/R1) | 1.44 | 1.30 | 1.33 | 1.56 |
|  | Presence or absence of bent portion (20% compression test) | Absence | Absence | Absence | Presence |
|  | Presence or absence of bent portion (30% compression test) | Absence | Absence | Absence | Presence |
|  | Cracking of conductive portion (20% compression test) | ○○ | ○○○ | ○○○ | x |
|  | Cracking of conductive portion (30% compression test) | ○○ | ○○○ | ○○○ | x |
| Connection structure | Connection failure 1 | ○ | ○ | ○ | x |
|  | Connection failure 2 | ○○ | ○○○ | ○○○ | x |

TABLE 5

|  |  | Example 22 | Example 23 | Example 24 |
|---|---|---|---|---|
| Base particle | Type of base particle | S1 | S1 | S1 |
| Conductive particle | Particle diameter (μm) | 400 | 400 | 400 |
|  | Presence or absence of protrusion | Absence | Absence | Absence |
|  | Metal constituting first conductive portion | Ni | Ni | Ni |
|  | Thickness of first conductive portion (μm) | 2.3 | 2.8 | 3.3 |
|  | Metal constituting second conductive portion | Cu | Cu | Cu |
|  | Thickness of second conductive portion (μm) | 2.0 | 1.5 | 1.0 |
|  | Metal constituting third conductive portion | Au | Au | Au |
|  | Thickness of third conductive portion (μm) | 0.5 | 0.5 | 0.5 |
|  | Metal constituting fourth conductive portion |  |  |  |
|  | Thickness of fourth conductive portion (μm) |  |  |  |
|  | Thickness of conductive portion (μm) | 4.8 | 4.8 | 4.8 |
|  | Particle diameter of conductive particle (μm) | 410 | 410 | 410 |
|  | Ratio (particle diameter of conductive particle/thickness of conductive portion) | 85 | 85 | 85 |
|  | Resistance value (R1) (mΩ) | 62 | 81 | 96 |
|  | Resistance value (R20) (mΩ) | 80 | 108 | 142 |
|  | Ratio (R20/R1) | 1.29 | 1.33 | 1.48 |
|  | Presence or absence of bent portion (20% compression test) | Absence | Absence | Absence |
|  | Presence or absence of bent portion (30% compression test) | Absence | Absence | Absence |
|  | Cracking of conductive portion (20% compression test) | ○○ | ○○ | ○○ |
|  | Cracking of conductive portion (30% compression test) | ○○ | ○ | ○ |

TABLE 5-continued

|  |  | Example 22 | Example 23 | Example 24 |
|---|---|---|---|---|
| Connection structure | Connection failure 1 | ○ | ○ | ○ |
|  | Connection failure 2 | ○○ | ○○ | ○ |

EXPLANATION OF SYMBOLS

1: Conductive particle
2: Base particle
3: Conductive portion
11: Conductive particle
11a: Protrusion
12: Conductive portion
12a: Protrusion
13: Core substance
21: Conductive particle
21a: Protrusion
22: Conductive portion
22a: Protrusion
22A: First conductive portion
22Aa: Protrusion
22B: Second conductive portion
22Ba: Protrusion
31: Insulating member
31a: Through hole
32: Solder paste portion
33: Electrode
34: Solder ball
35: Metal terminal (metal pin)
51, 101: Connection structure
52: First connection object member
52a: First electrode
53: Second connection object member
53a: Second electrode
54, 104: Connection portion

The invention claimed is:

1. A conductive particle comprising:
a base particle; and
a conductive portion disposed on a surface of the base particle,
a particle diameter of the conductive particle being 30 μm or more, and
a ratio of a resistance value (R20) of the conductive particle to a resistance value (R1) of the conductive particle being 1.5 or less,
wherein, provided that a process of applying a load at a smooth indenter end face of a cylinder at 25° C. until the conductive particle is 20% compressed and deformed in a center direction of the conductive particle and performing unloading is defined as 1 cycle, the resistance value (R20) of the conductive particle is measured after performing a compression test of 20 cycles in total, and the resistance value (R1) of the conductive particle is measured after performing a compression test of 1 cycles.

2. The conductive particle according to claim 1, wherein a material of the conductive portion contains a ductile metal.

3. The conductive particle according to claim 1, wherein the conductive portion has a two or more-layer laminated structure, and
a layer other than an outer surface of the conductive portion includes a layer containing a ductile metal.

4. The conductive particle according to claim 3, wherein a material of the outer surface of the conductive portion is gold, silver, copper, tin, zinc, nickel, beryllium, cobalt, palladium, platinum, rhodium, ruthenium, iridium, or an alloy thereof.

5. The conductive particle according to claim 3, wherein the layer containing the ductile metal has a thickness of 0.6 μm or more.

6. The conductive particle according to claim 1, wherein the conductive portion has a thickness of 0.3 μm or more and 20 μm or less.

7. The conductive particle according to claim 1, wherein the conductive portion has a thickness of 0.6 μm or more and 20 μm or less.

8. The conductive particle according to claim 1, wherein a ratio of the particle diameter of the conductive particle to the thickness of the conductive portion is 5 or more and 300 or less.

9. The conductive particle according to claim 1, having a plurality of protrusions on the outer surface of the conductive portion.

10. The conductive particle according to claim 1, wherein a load required for 20% compression deformation of the conductive particle is 50 N or less.

11. The conductive particle according to claim 1, wherein a load required for 30% compression deformation of the conductive particle is 100 N or less.

12. A connection structure comprising:
a first connection object member having a first electrode on a surface of the first connection object member;
a second connection object member having a second electrode on a surface of the second connection object member; and
a connection portion having an insulating member and a conductive particle,
the conductive particle being the conductive particle according to claim 1, and
the first electrode and the second electrode being electrically connected to each other by the conductive particle.

13. A conductive particle comprising:
a base particle; and
a conductive portion disposed on a surface of the base particle,
a particle diameter of the conductive particle being 30 μm or more, and
no bent portion being present in a displacement compressive load curve in a compression test in which loading and unloading up to 20% compression deformation of the conductive particle are repeated 20 times.

14. The conductive particle according to claim 13, wherein no bent portion is present in a displacement compressive load curve in a compression test in which loading and unloading up to 30% compression deformation of the conductive particle are repeated 20 times.

* * * * *